US012284836B2

(12) United States Patent
Wang

(10) Patent No.: US 12,284,836 B2
(45) Date of Patent: Apr. 22, 2025

(54) IMAGE SENSOR WHEREIN FOCUS OF LENS OF AN OPTICAL COMPONENT MISALIGNED A CENTER OF A PHOTODIODE

(71) Applicant: VisEra Technologies Company Ltd., Hsin-Chu (TW)

(72) Inventor: Wei-Ko Wang, Hsin-Chu (TW)

(73) Assignee: VisEra Technologies Company Ltd., Hsin-Chu (TW)

( * ) Notice: Subject to any disclaimer, the term of this patent is extended or adjusted under 35 U.S.C. 154(b) by 414 days.

(21) Appl. No.: 17/750,280

(22) Filed: May 20, 2022

(65) Prior Publication Data

US 2023/0378226 A1 Nov. 23, 2023

(51) Int. Cl.
*H10F 39/18* (2025.01)
*H10F 39/00* (2025.01)

(52) U.S. Cl.
CPC ......... *H10F 39/18* (2025.01); *H10F 39/8053* (2025.01); *H10F 39/806* (2025.01)

(58) Field of Classification Search
CPC ......... H01L 27/14643; H01L 27/14621; H01L 27/14625; H01L 27/14605; H01L 27/14678; H10F 39/18; H10F 39/198; H10F 39/8023; H10F 39/806
See application file for complete search history.

(56) References Cited

U.S. PATENT DOCUMENTS

| | | | | |
|---|---|---|---|---|
| 9,117,718 B2 * | 8/2015 | Ohshitanai | ........ | H01L 27/14627 |
| 9,182,628 B2 * | 11/2015 | Chen | ...................... | G02B 30/28 |
| 11,024,659 B2 * | 6/2021 | Hur | ................... | H01L 27/14643 |
| 11,069,731 B2 * | 7/2021 | Lin | ...................... | H01L 27/1464 |
| 2007/0063126 A1 * | 3/2007 | Lee | ................... | H01L 27/14623 |
| | | | | 257/E27.132 |
| 2009/0200623 A1 * | 8/2009 | Qian | ..................... | G02B 3/0018 |
| | | | | 257/E31.127 |
| 2010/0159696 A1 * | 6/2010 | Kim | ..................... | G02B 3/0018 |
| | | | | 257/E21.294 |
| 2017/0125476 A1 | 5/2017 | Kato et al. | | |
| 2020/0365629 A1 * | 11/2020 | Ogi | ..................... | H01L 27/1464 |
| 2021/0225926 A1 * | 7/2021 | Peng | ................. | H01L 27/14627 |

FOREIGN PATENT DOCUMENTS

EP 2723062 4/2014

* cited by examiner

*Primary Examiner* — Khiem D Nguyen
(74) *Attorney, Agent, or Firm* — LIU & LIU

(57) ABSTRACT

An image sensor includes a photodiode array having a plurality of photodiodes, a grid disposed over the photodiode array, and a plurality of optical components disposed over the grid and corresponding to the plurality of apertures, respectively. The grid defines a plurality of apertures corresponding to the plurality of photodiodes, respectively. The optical components includes a first optical component above a first photodiode of the plurality of photodiodes, the first optical component includes at least one lens and provides at least one focus on the first photodiode, in which the focus of the lens of the first optical component misaligns a center of the first photodiode, in a plan view.

18 Claims, 25 Drawing Sheets

IMAGE SENSOR WHEREIN FOCUS OF LENS OF AN OPTICAL COMPONENT MISALIGNED A CENTER OF A PHOTODIODE

BACKGROUND

Field of Invention

The present disclosure relates to an image sensor.

Description of Related Art

Image devices have been widely used in various image-capturing apparatuses, for example video cameras, digital cameras and the like. Generally, solid-state imaging devices, for example charge-coupled device (CCD) sensors or complementary metal-oxide semiconductor (CMOS) sensors, have photoelectric transducers such as photodiodes for converting light into electric charges. The photodiodes are formed on a semiconductor substrate such as a silicon chip. Signal charges corresponding to photoelectrons generated in the photodiodes are obtained by a CCD-type or a CMOS-type reading circuit.

SUMMARY

An aspect of the disclosure provides an image sensor. The image sensor includes a photodiode array having a plurality of photodiodes, a grid disposed over the photodiode array, and a plurality of optical components disposed over the grid and corresponding to the plurality of apertures, respectively. The grid defines a plurality of apertures corresponding to the plurality of photodiodes, respectively. The optical components includes a first optical component above a first photodiode of the plurality of photodiodes, the first optical component includes at least one lens and provides at least one focus on the first photodiode, in which the focus of the lens of the first optical component misaligns a center of the first photodiode, in a plan view.

In some embodiments, a number of the at least one lens of the first optical component is plural, and the focuses of the lenses of the first optical component misalign the center of the first photodiode, in the plan view.

In some embodiments, the focuses of the lenses of the first optical component are selected from a group consisting of focus points, focus lines, and a combination thereof.

In some embodiments, the lenses of the first optical component have at least two sizes.

In some embodiments, the lenses of the first optical component have the same size.

In some embodiments, the lenses of the first optical component are circular lenses, lenticular lenses, or a combination thereof.

In some embodiments, an arrangement of the lenses of the first optical component is symmetrical.

In some embodiments, the lenses of the first optical component are isolated from each other.

In some embodiments, at least two of the lenses of the first optical component are merged or in contact.

In some embodiments, at least two of the lenses of the first optical component are merged or in contact, and at least two of the lenses of the first optical component are isolated from each other.

In some embodiments, a number of the at least one lens of the first optical component is single.

In some embodiments, a shape of the lens of the first optical component is a donut-shape or a C-shape.

In some embodiments, the plurality of optical components includes a second optical component above a second photodiode of the plurality of photodiodes, the second optical component includes at least one lens and provides at least one focus on the second photodiode, in which the focus of the lens of the second optical component misaligns a center of the second photodiode, in the plan view.

In some embodiments, an arrangement of the at least one lens of the second optical component is different from an arrangement of the at least one lens of the first optical component.

In some embodiments, an arrangement of the at least one lens of the second optical component is the same as an arrangement of the at least one lens of the first optical component.

In some embodiments, the second optical component is spaced from the first optical component.

In some embodiments, the second optical component is connected to the first optical component.

In some embodiments, the image sensor further includes a metal pad disposed between the first photodiode and the first optical component.

In some embodiments, the metal pad overlaps the center of the first photodiode, in the plan view.

In some embodiments, the image sensor further includes a plurality of waveband filters filled in the apertures, respectively.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
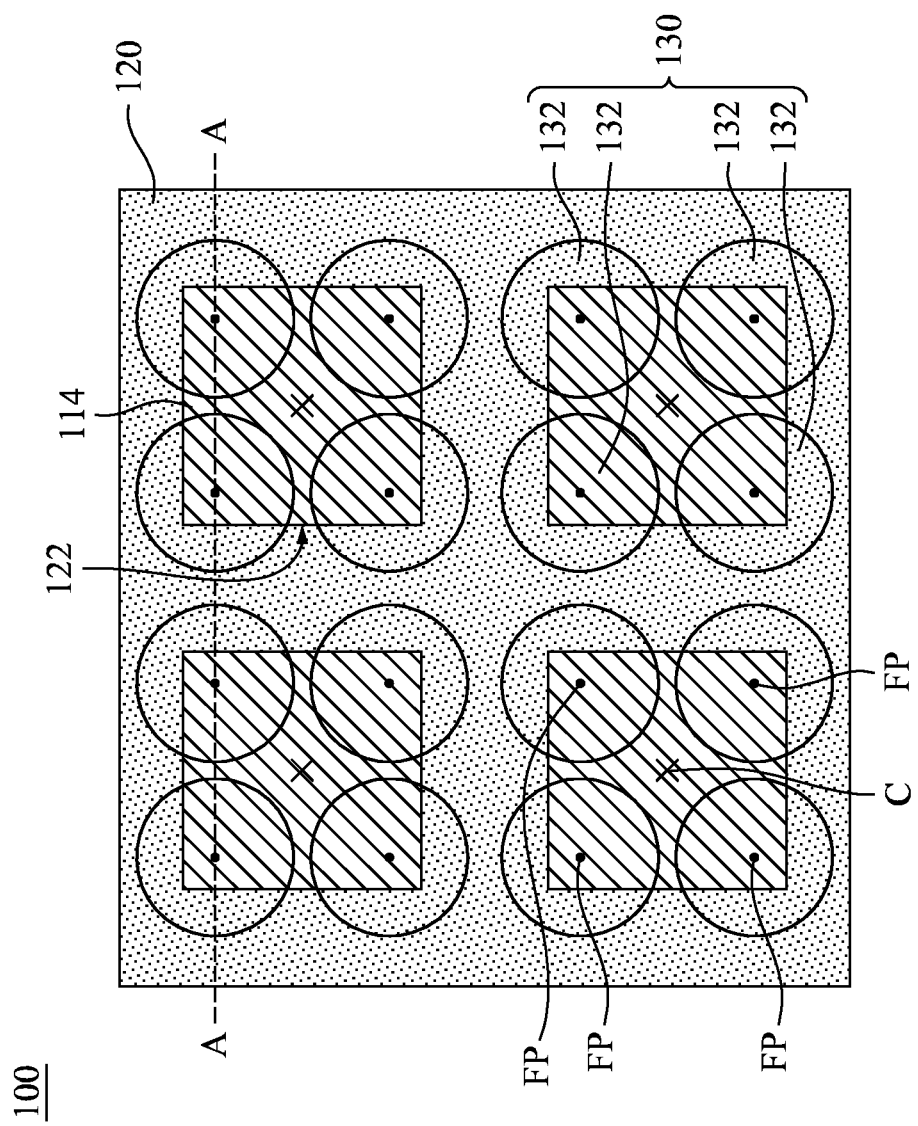
FIG. 1 is a schematic top view of an image sensor according to a first embodiment of the disclosure.

Reference will now be made in detail to the present embodiments of the invention, examples of which are illustrated in the accompanying drawings. Wherever possible, the same reference numbers are used in the drawings and the description to refer to the same or like parts.

Figure 2:
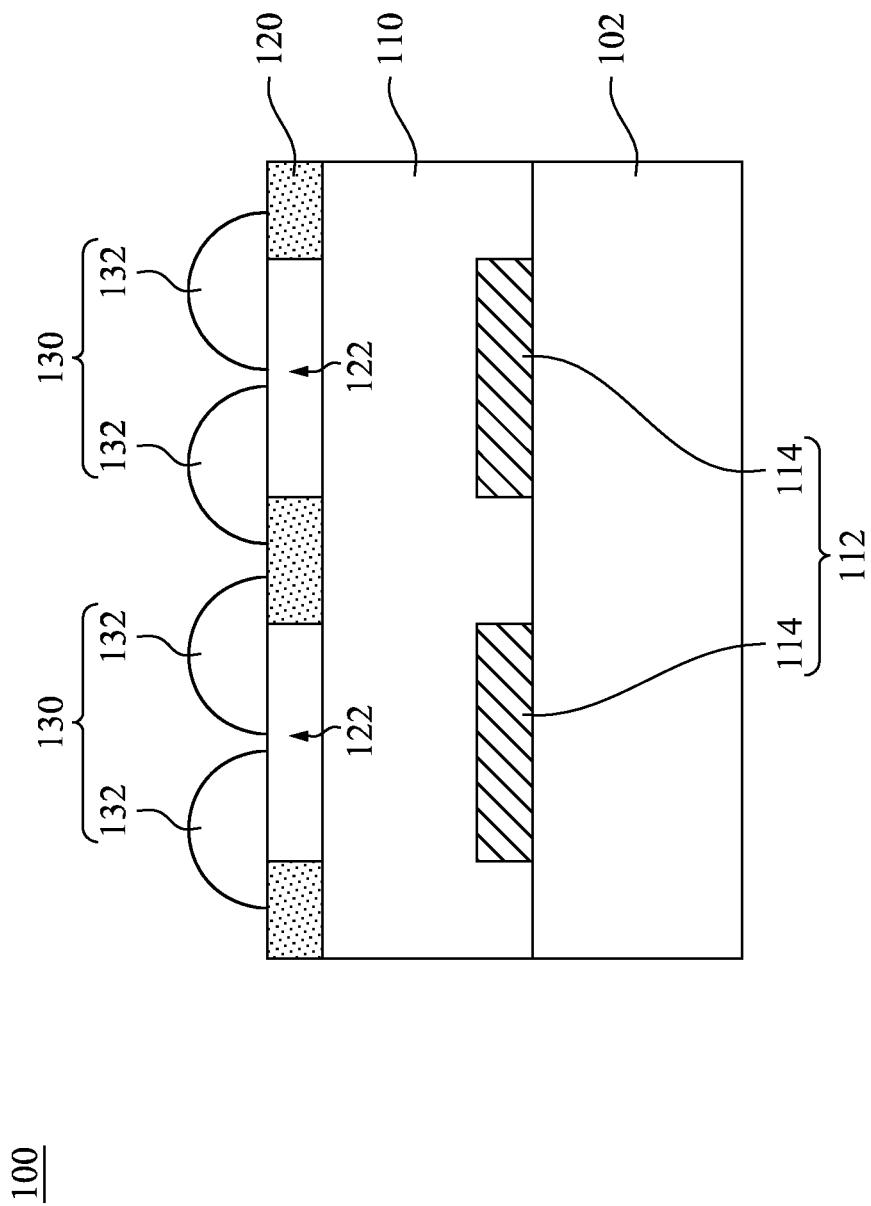
FIG. 2 is a cross-sectional view taken along line A-A in FIG. 1.

Reference is made to FIG. 1 and FIG. 2, in which is FIG. 1 is a schematic top view of an image sensor according to a first embodiment of the disclosure, and FIG. 2 is a cross-sectional view taken along line A-A in FIG. 1. The image sensor 100 includes a photodiode layer 110 formed on a substrate 102, a grid 120 disposed over the photodiode layer 110, and a plurality of optical components 130 disposed over the grid 120. The photodiode layer 110 includes a photodiode array 112 having a plurality of photodiodes 114, and the grid 120 defines a plurality of apertures 122 corresponding to the photodiodes 114, respectively. The optical components 130 are disposed over the grid 120 and correspond to the apertures 122, respectively.

In some embodiments, each of the optical components 130 includes a plurality of lenses 132, and the lenses 132 are disposed above the corresponding photodiode 114. In some embodiments, an arrangement of the lenses 132 of each of the optical component 130 is symmetrical. For example, the number of the lenses 132 of each of the optical components 130 is four, and the lenses 132 are evenly arranged on the corners of the corresponding aperture 122.

The lenses 132 provide a plurality of focus points FP on the corresponding photodiode 114, to converge light on the corresponding photodiode 114. The focus points FP of the lenses 132 misalign a center C of the corresponding photodiode 114, in the plan view. The center C of each of the photodiode 114 is the centroid or geometric center of the photodiode 114, in the plan view.

In some embodiments, the lenses 132 of each optical component 130 are circular lenses and are substantially identical. For example, the lenses 132 of each optical component 130 may have the same shape, the same size, the same curvature, and the same height. The lenses 132 of each optical component 130 partially overlap the grid 120, and the focus points FP of the lenses 132 of each optical component 130 are landed on the corresponding photodiode 114. In some embodiments, the lenses 132 of each optical component 130 do not cover the center C of the corresponding photodiode 114.

In some embodiments, the lenses 132 of each optical component 130 are isolated from each other. Namely, the edges of adjacent two of the lenses 132 of each optical component 130 are spaced apart from each other. The adjacent two of the lenses 132 of each optical component 130 are not directly or physically connected.

Figure 3:
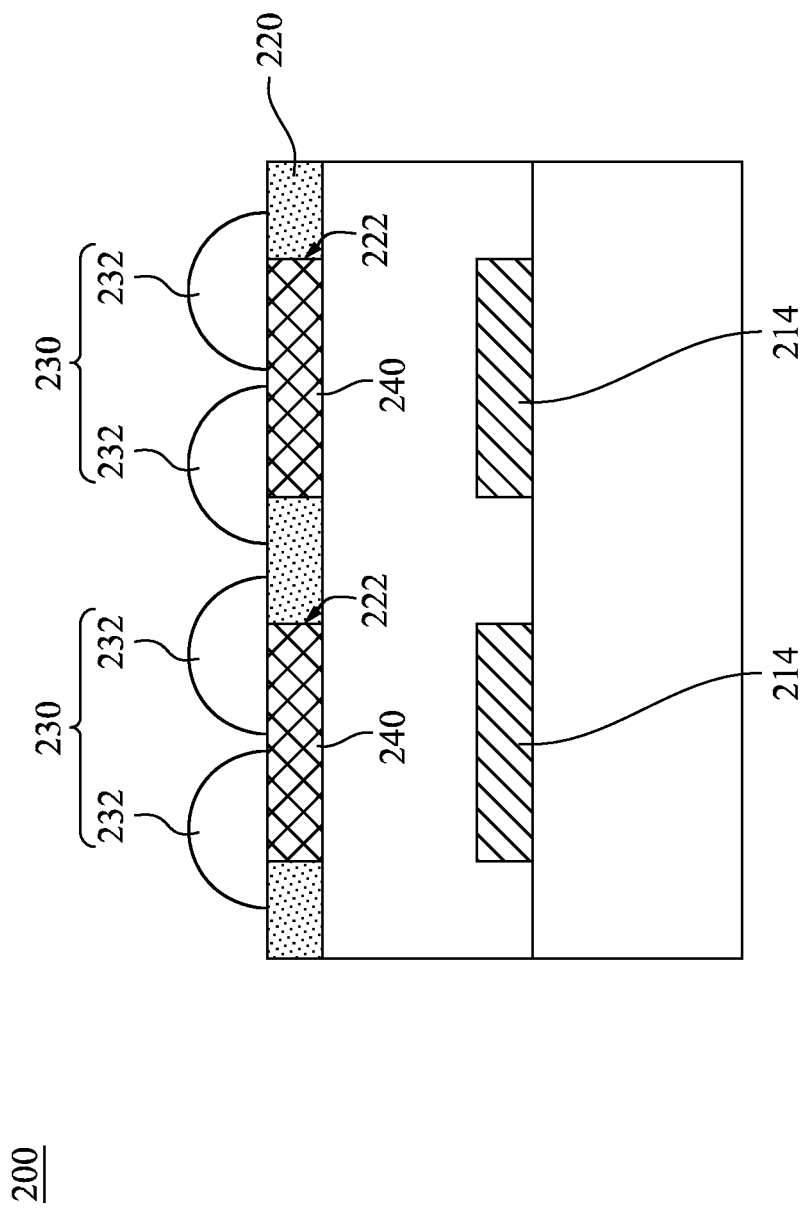
FIG. 3 is a cross-sectional view of the image sensor according to a second embodiment of the disclosure.

Reference is made to FIG. 3, which is a cross-sectional view of the image sensor according to a second embodiment of the disclosure. The image sensor 200 includes a plurality of optical components 230 disposed over the grid 220 and corresponding to the photodiodes 214, respectively. The optical components 230 are disposed over the apertures 222, respectively. Each of the optical components 230 includes a plurality of lenses 232, and the lenses 232 are disposed above the corresponding photodiode 214. In some embodiments, the image sensor 200 further includes a plurality of waveband filters 240 disposed in the apertures 222, respectively. The waveband filters 240 are configured to absorb light in specific wavelength ranges and let other wavelength ranges pass through and reach on the photodiodes 214.

Figure 4:
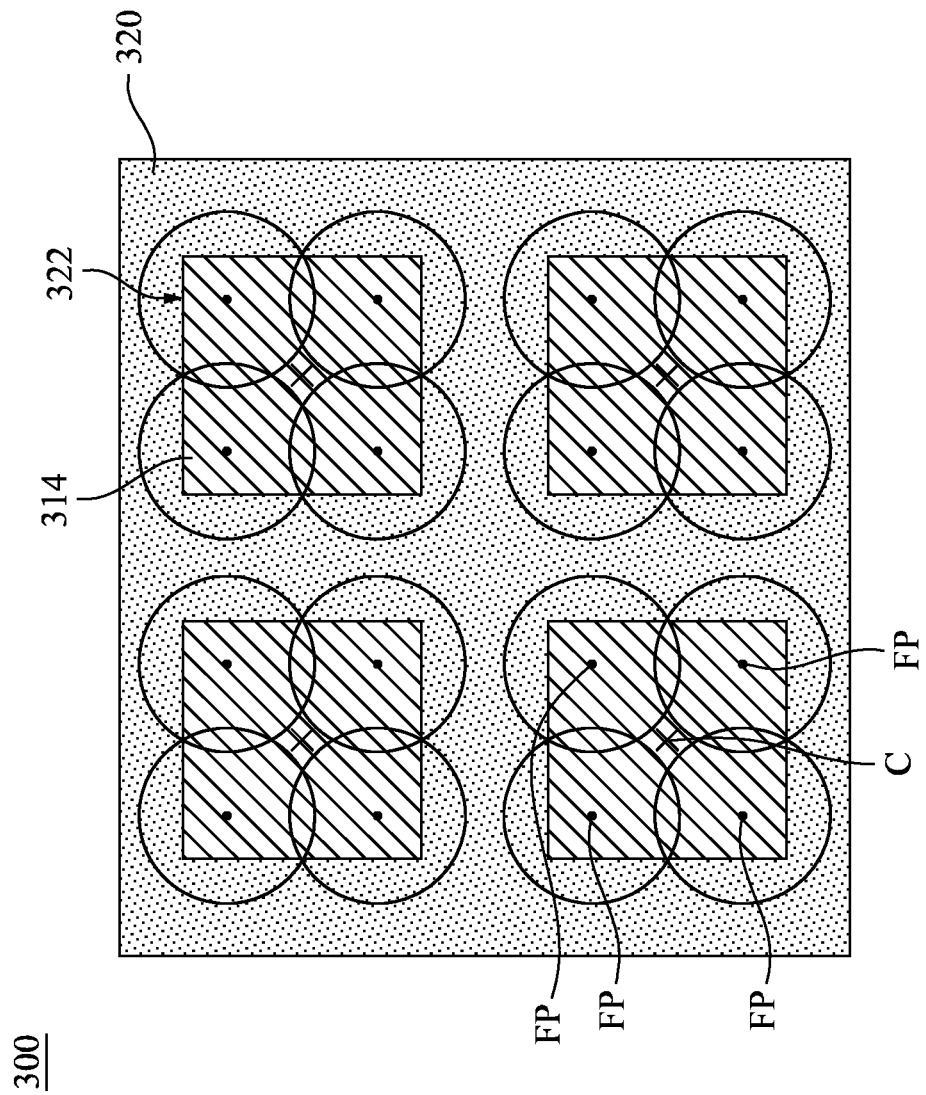
FIG. 4 is a schematic top view of the image sensor according to a third embodiment of the disclosure.

Reference is made to FIG. 4, which is a schematic top view of the image sensor according to a third embodiment of the disclosure. The image sensor 300 includes a plurality of optical components 330 disposed over the grid 320 and corresponding to the photodiodes 314, respectively. The optical components 330 are disposed over the apertures 322, respectively. Each of the optical components 330 includes a plurality of lenses 332 and disposed above the corresponding photodiode 314, the lenses 332 of each optical component 330 of the image sensor 300 are merged. Namely, the edges of adjacent two of the lenses 332 of each optical component 330 are physically connected to each other. The focus points FP of the lenses 332 of each optical component 330 are misaligned with the center C of the corresponding photodiode 314, in the plan view. The optical components 330 are spaced apart from each other.

Figure 5:
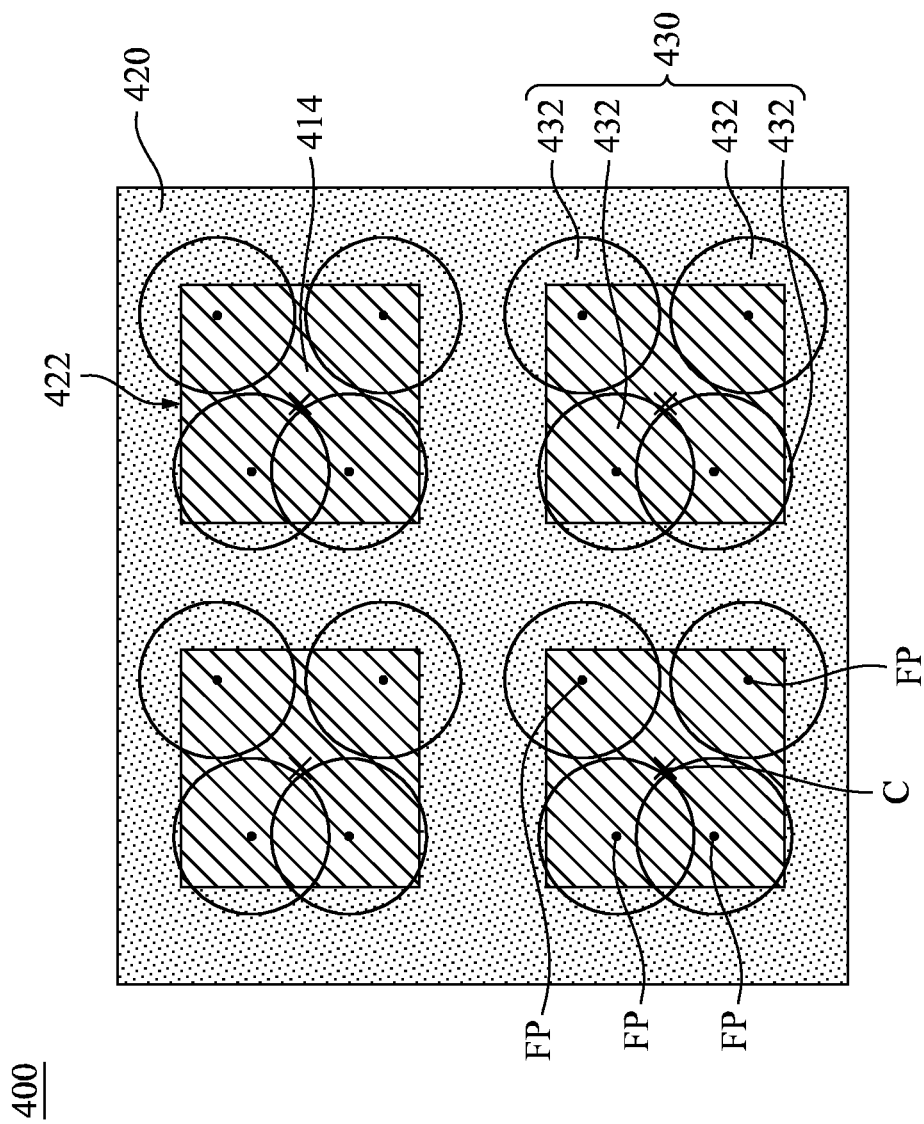
FIG. 5 is a schematic top view of the image sensor according to a fourth embodiment of the disclosure.

Reference is made to FIG. 5, which is a schematic top view of the image sensor according to a fourth embodiment of the disclosure. The image sensor 400 includes a plurality of optical components 430 disposed over the grid 420 and corresponding to the photodiodes 414, respectively. The optical components 430 are disposed over the apertures 422, respectively. The optical components 430 are spaced apart from each other. Each of the optical components 430 includes a plurality of lenses 4321, 4322, 4323, and 4324, and the lenses 4321-4324 are disposed above the corresponding photodiode 414.

In some embodiments, at least two of the lenses 4321-4324, such as the lenses 4321 and 4322, are merged, and at least two of the lenses 4321-4324, such as the lenses 4323 and 4324, are isolated from each other. The distance d1 between the focus points FP of the lenses 4321 and 4322 is shorter than the distance d2 between the focus points FP of the lenses 4323 and 4324. The focus points FP of the lenses 4321-4324 are misaligned with the center C of the corresponding photodiode 414, in the plan view. In some embodiments, the lenses 4321-4324 have the same size.

Figure 6:
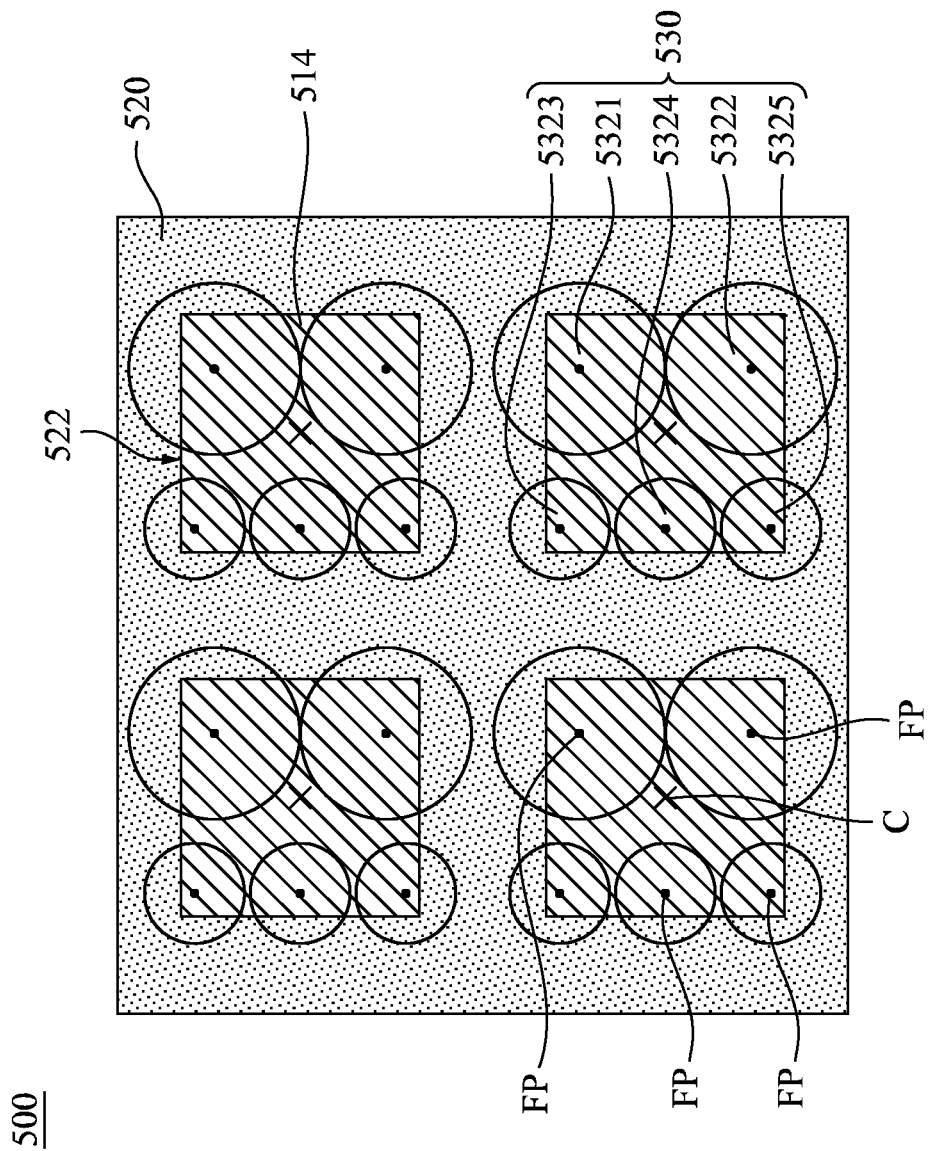
FIG. 6 is a schematic top view of the image sensor according to a fifth embodiment of the disclosure.

Reference is made to FIG. 6, which is a schematic top view of the image sensor according to a fifth embodiment of the disclosure. The image sensor 500 includes a plurality of optical components 530 disposed over the grid 520 and corresponding to the photodiodes 514, respectively. The optical components 530 are disposed over the apertures 522, respectively. Each of the optical components 530 includes a plurality of lenses 5321, 5322, 5323, 5324, and 5325, and the lenses 5321-5325 are disposed above the corresponding photodiode 514.

In some embodiments, at least two of the lenses 5321-5325, such as the lenses 5321 and 5322, are merged or in contact, and at least two of the lenses 5321-5325, such as the lenses 5323, 5324, and 5325, are isolated from each other. The focus points FP of the lenses 5321-5325 are misaligned with the center C of the corresponding photodiode 514, in the plan view. In some embodiments, the lenses 5321-5325 of the optical component 530 have at least two sizes. For example, the lenses 5323, 5324, and 5325 have a size smaller than that of the lenses 5321 and 5322.

Figure 7:
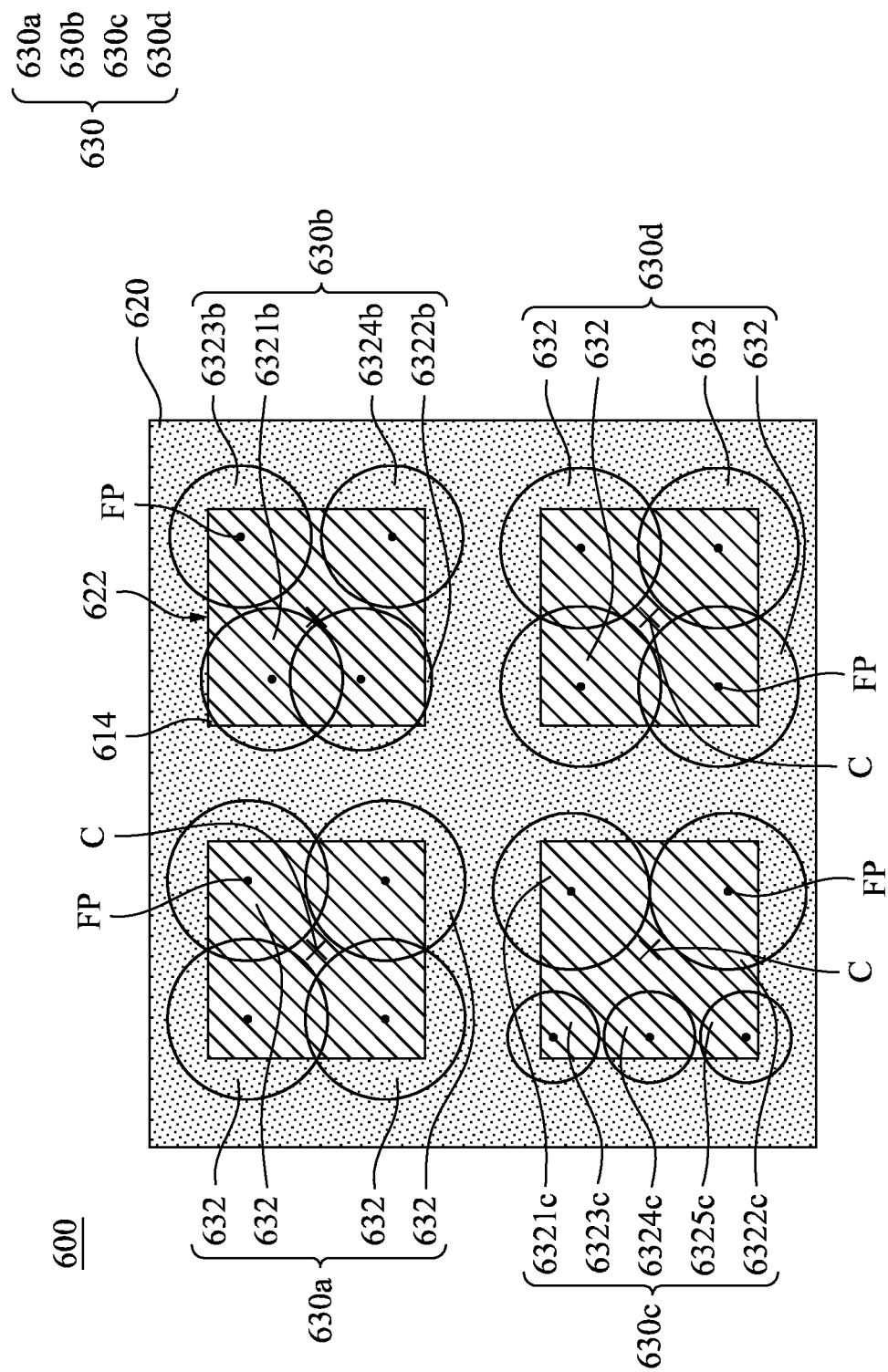
FIG. 7 is a schematic top view of the image sensor according to a sixth embodiment of the disclosure.

Reference is made to FIG. 7, which is a schematic top view of the image sensor according to a sixth embodiment of the disclosure. The image sensor 600 includes a plurality of optical components 630 disposed over the apertures 622 of the grid 620 and corresponding to the photodiodes 614, respectively. The optical components 630 of the image sensor 600 may have two or more arrangements. The focus points FP of all of the lenses of the optical components 630 misalign the centers C of the photodiodes 614, in the plan view.

For example, the optical components 630 include a first optical component 630a, a second optical component 630b, a third optical component 630c, and a fourth optical component 630d respectively disposed on the photodiodes 614. The first optical component 630a and the fourth optical component 630d have the same arrangement. The first optical component 630a, the second optical component 630b, and the third optical component 630c have the different arrangements. The first optical component 630a, the second optical component 630b, the third optical component 630c, and the fourth optical component 630d are spaced from each other.

More particularly, each of the first optical component 630a and the fourth optical component 630d has four lenses 632, and the lenses 632 have the same size and are merged. The second optical component 630b includes four lenses 6321b-6324b, in which the lenses 6321b and 6322b are merged or in contact, and lenses 6323b and 6324b are isolated from each other. The lenses 6321b-6324b of the second optical component 630b have the same size.

The third optical component 630c includes five lenses 6321c-6325c, in which the lenses 6321c and 6322c are merged or in contact, and the lenses 6323c, 6324c, and 6325c are isolated from each other. The size of the lenses 6323c, 6324c, and 6325c is smaller than that of the lenses 6321c and 6322c.

Figure 8:
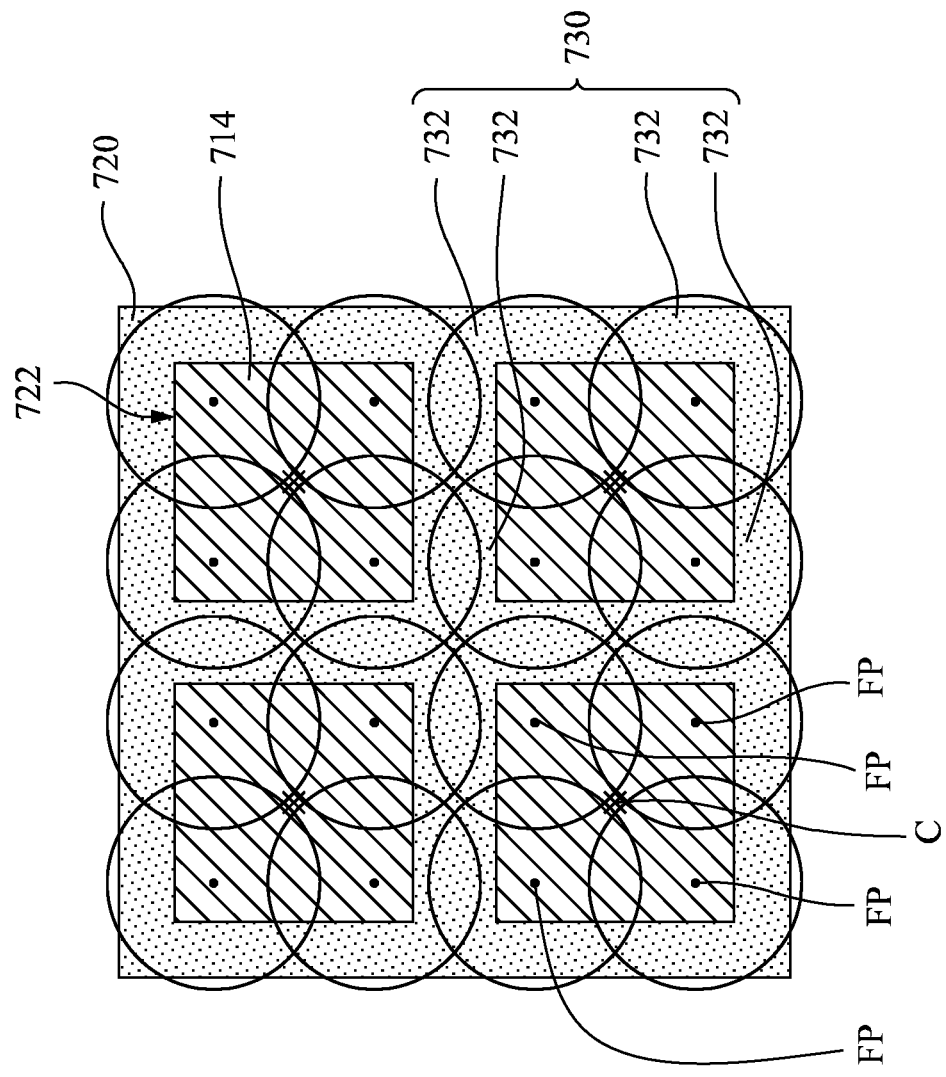
FIG. 8 is a schematic top view of the image sensor according to a seventh embodiment of the disclosure.

Reference is made to FIG. 8, which is a schematic top view of the image sensor according to a seventh embodiment of the disclosure. The image sensor 700 includes a plurality of optical components 730 disposed over the apertures 722 of the grid 720 and corresponding to the photodiodes 714, respectively. The focus points FP of all of the lenses 732 of the optical components 730 misalign the centers C of the photodiodes 714, in the plan view. In some embodiments, the optical components 730 are further connected. For example, the lenses 732 of each optical component 730 are merged, and the lenses 732 of adjacent optical component 730 are also merged.

Figure 9:
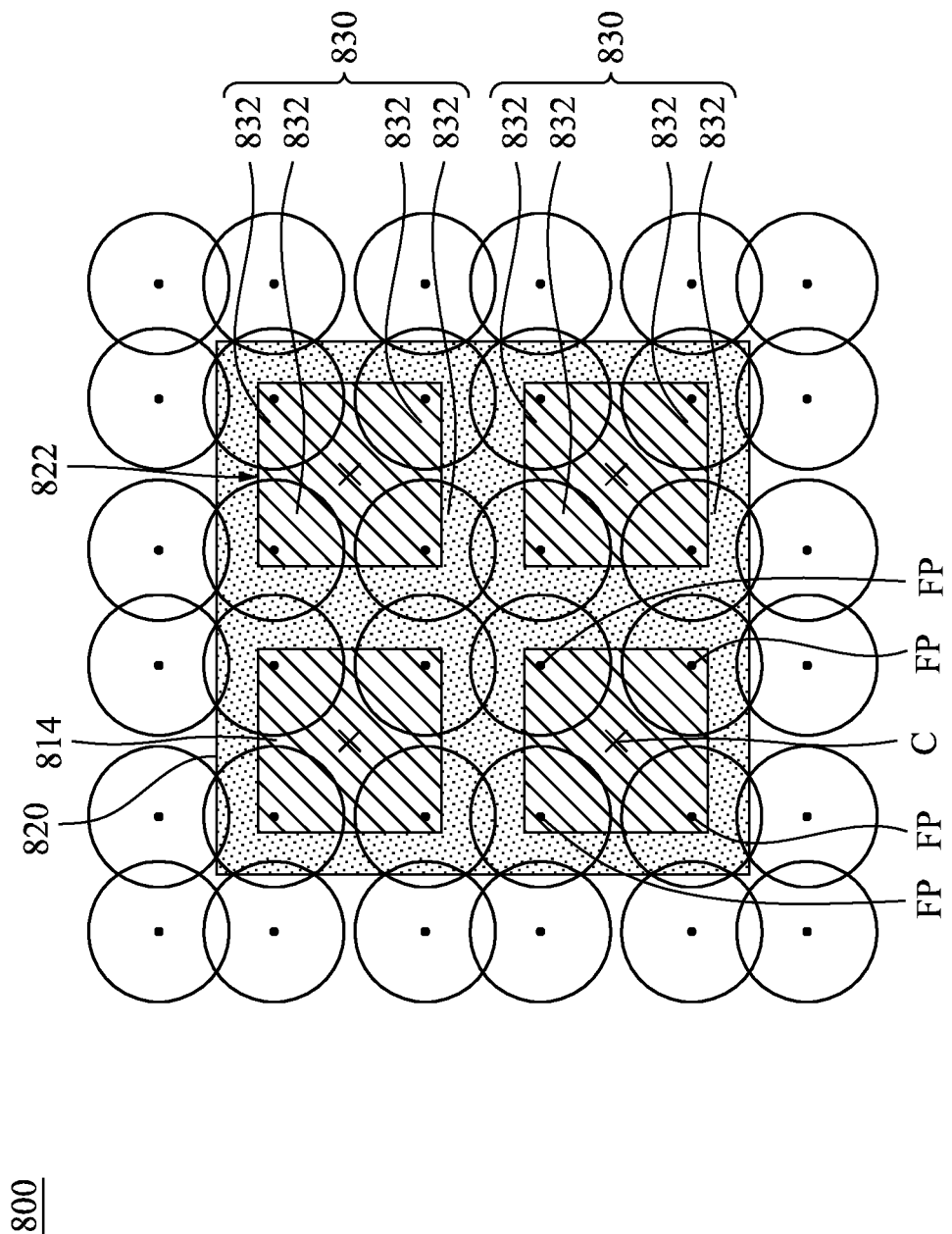
FIG. 9 is a schematic top view of the image sensor according to an eighth embodiment of the disclosure.

Reference is made to FIG. 9, which is a schematic top view of the image sensor according to an eighth embodiment of the disclosure. The image sensor 800 includes a plurality of optical components 830 disposed over the apertures 822 of the grid 820 and corresponding to the photodiodes 814, respectively. The focus points FP of all of the lenses 832 of the optical components 830 misalign the centers C of the photodiodes 814, in the plan view. In some embodiments, the optical components 730 are further connected. For example, the lenses 832 of each optical component 830 are isolated from each other, and the lenses 832 of adjacent optical component 830 are merged.

Figure 10:
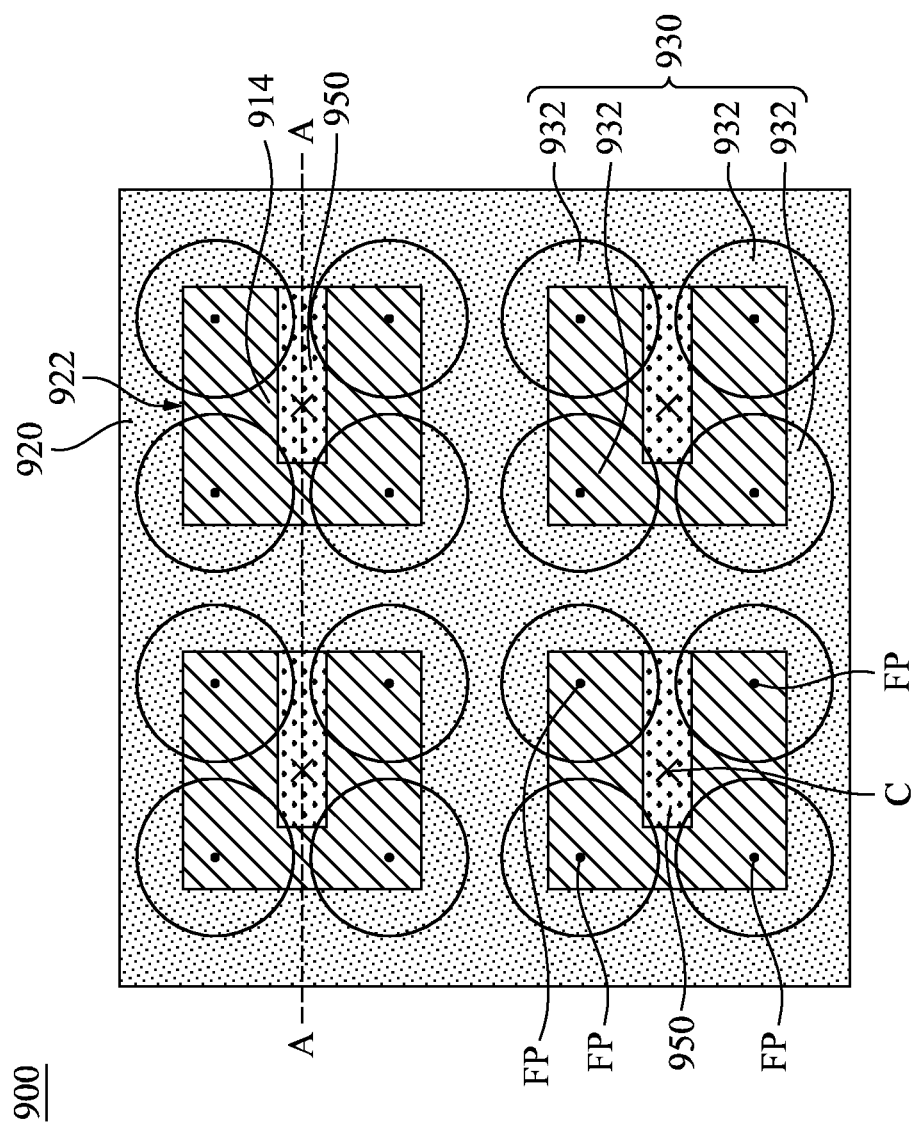
FIG. 10 is a schematic top view of the image sensor according to a ninth embodiment of the disclosure.
Figure 11:
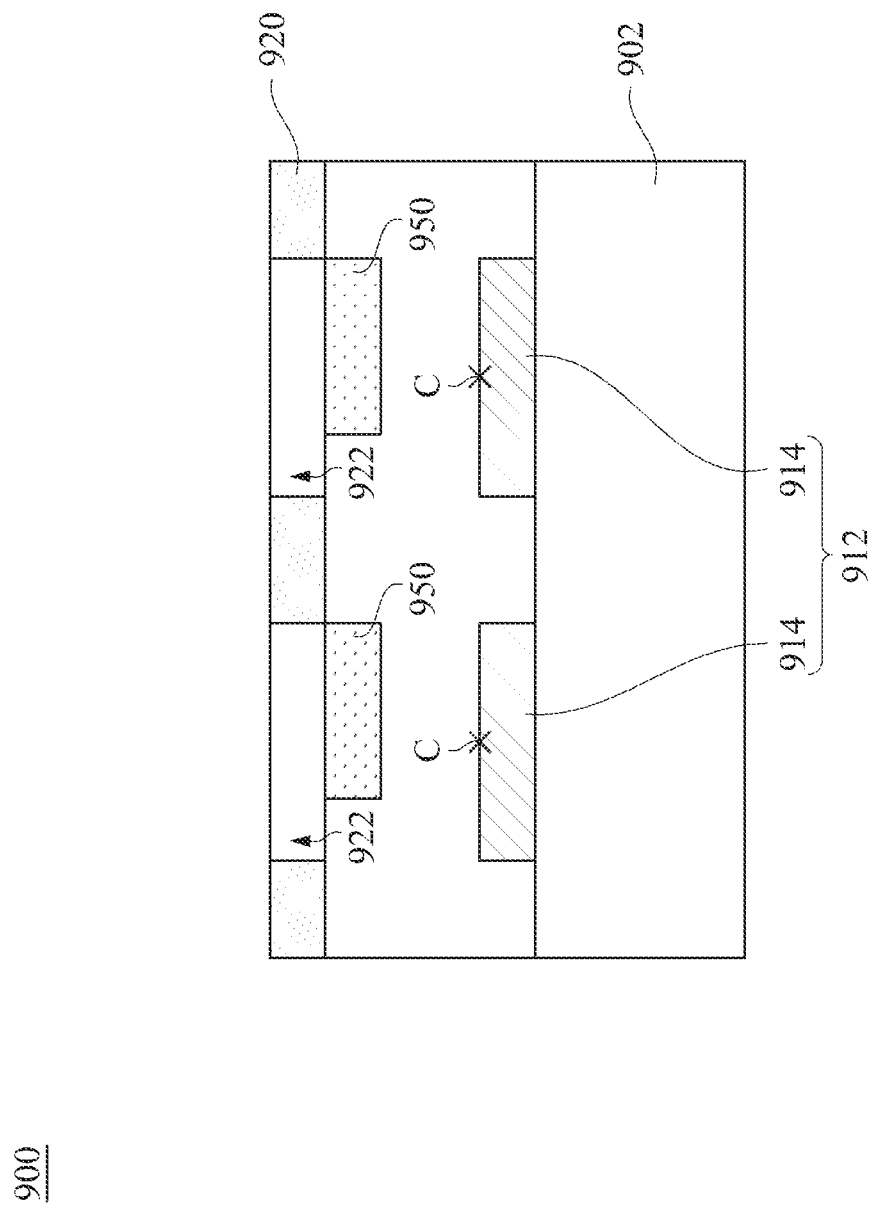
FIG. 11 is a cross-sectional view taken along line A-A of FIG. 10.

Reference is made to FIG. 10 and FIG. 11, in which FIG. 10 is a schematic top view of the image sensor according to a ninth embodiment of the disclosure, and FIG. 11 is a cross-sectional view taken along line A-A of FIG. 10. The image sensor 900 includes the photodiode layer 910 formed on the substrate 902, the grid 920 disposed over the photodiode layer 910, and a plurality of optical components 930 disposed over the grid 920. The photodiode layer 910 includes a photodiode array 912 having a plurality of photodiodes 914, and the grid 920 defines a plurality of apertures 922 corresponding to the photodiodes 914, respectively. The optical components 930 are disposed over the grid 920 and correspond to the apertures 922, respectively.

The image sensor 900 further includes a plurality of metal pads 950 disposed between the photodiodes 914 and the optical components 930, respectively. Each of the metal pads 950 overlaps the center C of the corresponding photodiode 914, in the plan view. The metal pads 950 are configured to provide bias voltage to the photodiodes 914. The photodiodes 914 are single-photon avalanche diodes.

The metal pads 950 are made of material that is not light-transparent. Namely, the metal pads 950 have a light-shielding ability. The focus points FP of all of the lenses 932 of the optical components 930 not only misalign the centers C of the photodiodes 914, but also misalign the metal pads 950, in the plan view. Therefore, the light converged by the lenses 932 of the optical components 930 can directly focus on the photodiodes 914 and would not be blocked by the metal pads 950.

In some embodiments, the lenses 932 of each optical component 930 are circular lenses and are substantially identical. The lenses 932 of each optical component 930 are isolated from each other. The optical components 930 are spaced from each other. Optionally, in some other embodiments, the image sensor 900 may further include a plurality of waveband filters filled in the apertures 922, respectively.

Figure 12:
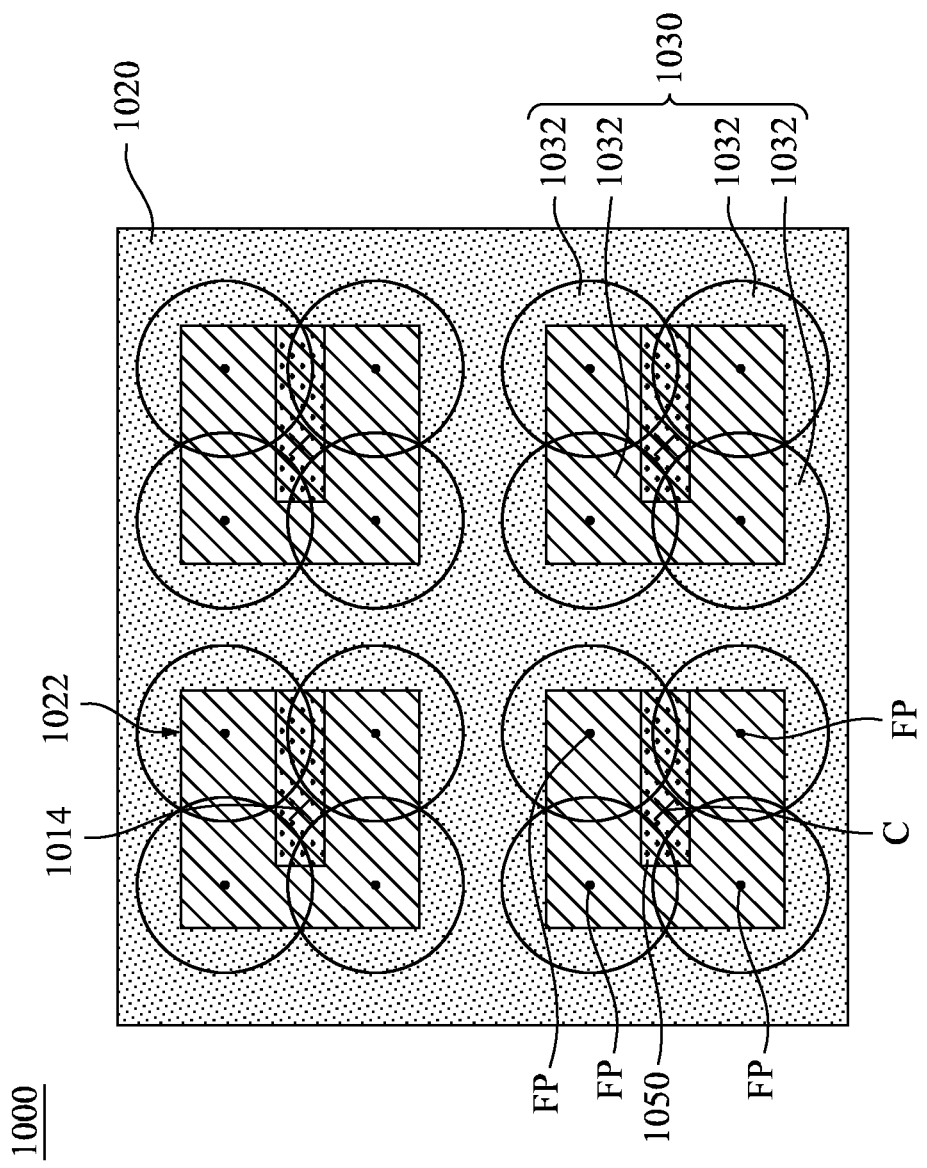
FIG. 12 is a schematic top view of the image sensor according to a tenth embodiment of the disclosure.

Reference is made to FIG. 12, which is a schematic top view of the image sensor according to a tenth embodiment of the disclosure. The image sensor 1000 includes a plurality of optical components 1030 disposed over the grid 1020 and corresponding to the photodiodes 1014, respectively. The optical components 1030 are disposed over the apertures 1022, respectively. The metal pads 1050 are disposed between the optical components 1030 and the photodiodes 1014, respectively. Each metal pad 1050 overlaps the center C of the corresponding photodiodes 1014. The optical components 1030 are spaced apart from each other.

Each of the optical components 1030 includes a plurality of lenses 1032 and disposed above the corresponding photodiode 1014, the lenses 1032 of each optical component 1030 of the image sensor 1000 are merged. The focus points FP of the lenses 1032 of each optical component 1030 misalign the corresponding metal pad 1050 in the plan view, such that the light converged by the lenses 1032 of the optical components 1030 can directly focus on the photodiodes 1014 and would not be blocked by the metal pads 1050.

Figure 13:
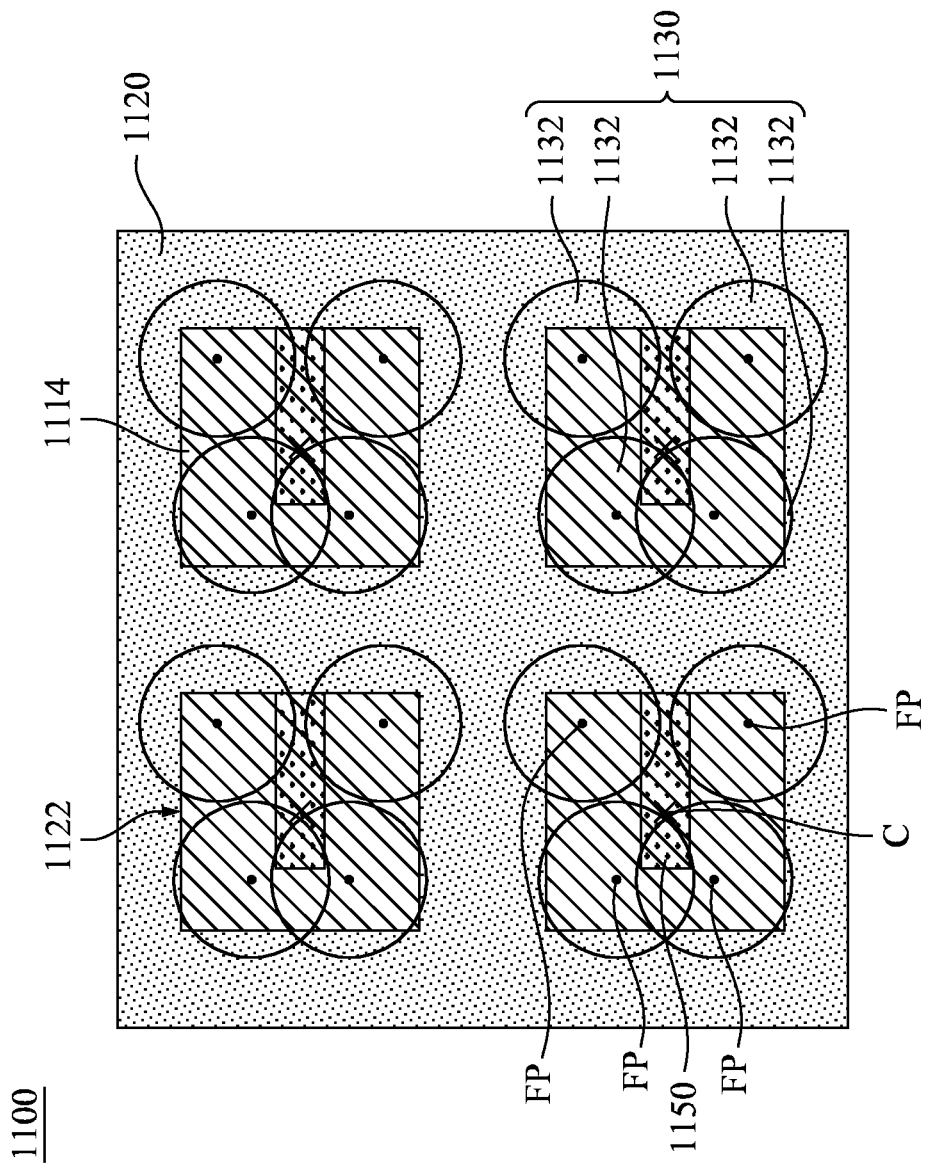
FIG. 13 is a schematic top view of the image sensor according to an eleventh embodiment of the disclosure.

Reference is made to FIG. 13, which is a schematic top view of the image sensor according to an eleventh embodiment of the disclosure. The image sensor 1100 includes a plurality of optical components 1130 disposed over the grid 1120 and corresponding to the photodiodes 1114, respectively. The optical components 1130 are disposed over the apertures 1122, respectively. The optical components 1130 are spaced apart from each other. The metal pads 1150 are disposed between the optical components 1130 and the photodiodes 1114, respectively. Each metal pad 1150 overlaps the center C of the corresponding photodiodes 1114.

Each of the optical components 1130 includes a plurality of lenses 1132. The lenses 1132 have the same size. At least two of the lenses 1132 are merged or in contact, and at least two of the lenses 1132 are isolated from each other. The focus points FP of the lenses 1132 of each optical component 1130 misalign the corresponding metal pad 1150 in the plan view, such that the light converged by the lenses 1132 of the optical components 1130 can directly focus on the photodiodes 1114 and would not be blocked by the metal pads 1150.

Figure 14:
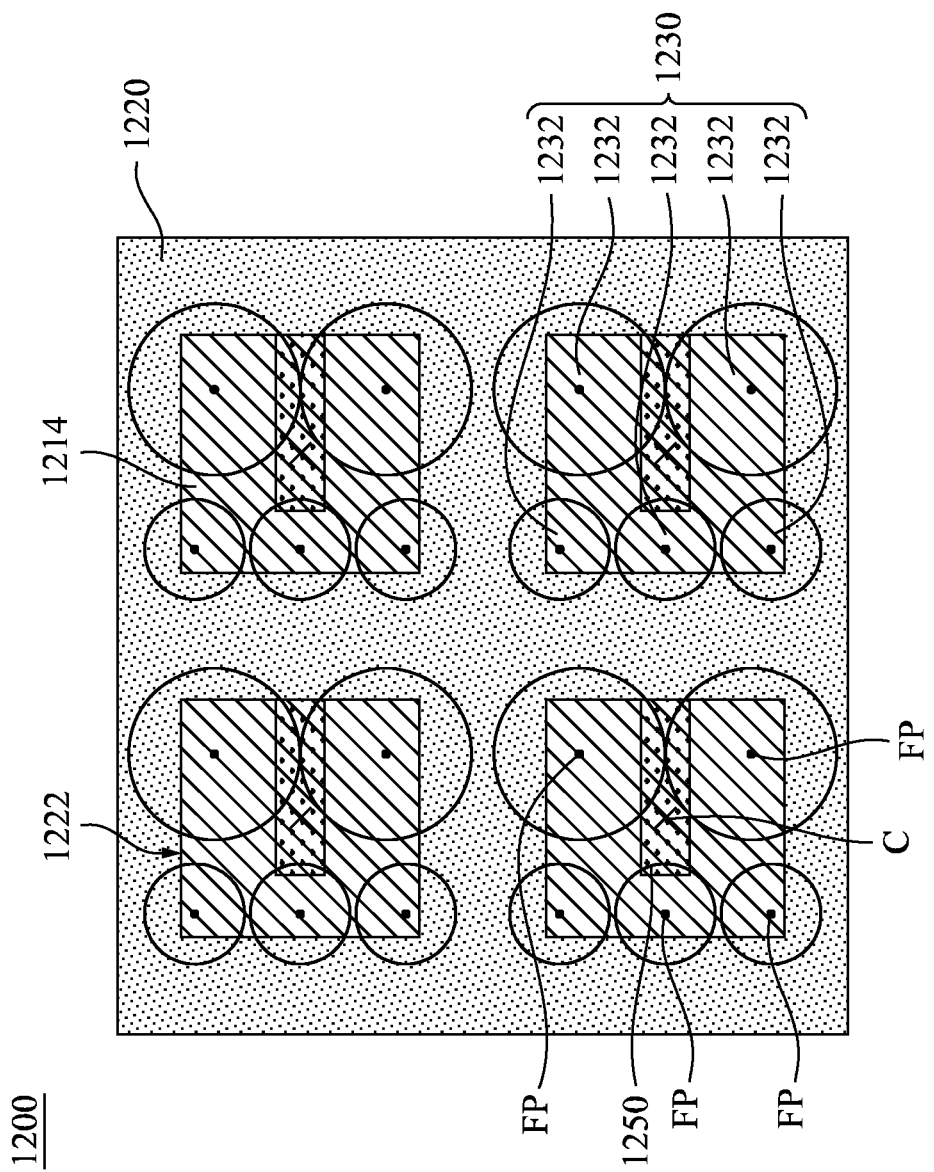
FIG. 14 is a schematic top view of the image sensor according to a twelfth embodiment of the disclosure.

Reference is made to FIG. 14, which is a schematic top view of the image sensor according to a twelfth embodiment of the disclosure. The image sensor 1200 includes a plurality of optical components 1230 disposed over the grid 1220 and corresponding to the photodiodes 1214, respectively. The optical components 1230 are disposed over the apertures 1222, respectively. The optical components 1230 are spaced apart from each other. The metal pads 1250 are disposed between the optical components 1230 and the photodiodes 1214, respectively. Each metal pad 1250 overlaps the center C of the corresponding photodiodes 1214.

Each of the optical components 1230 includes a plurality of lenses 1232. At least two of the lenses 1232 are merged or in contact, and at least two of the lenses 1232 are isolated from each other. In some embodiments, the lenses 1232 of the optical component 1230 have at least two sizes. The focus points FP of the lenses 1232 of each optical component 1230 misalign the corresponding metal pad 1250 in the plan view, such that the light converged by the lenses 1232 of the optical components 1230 can directly focus on the photodiodes 1214 and would not be blocked by the metal pads 1250.

Figure 15:
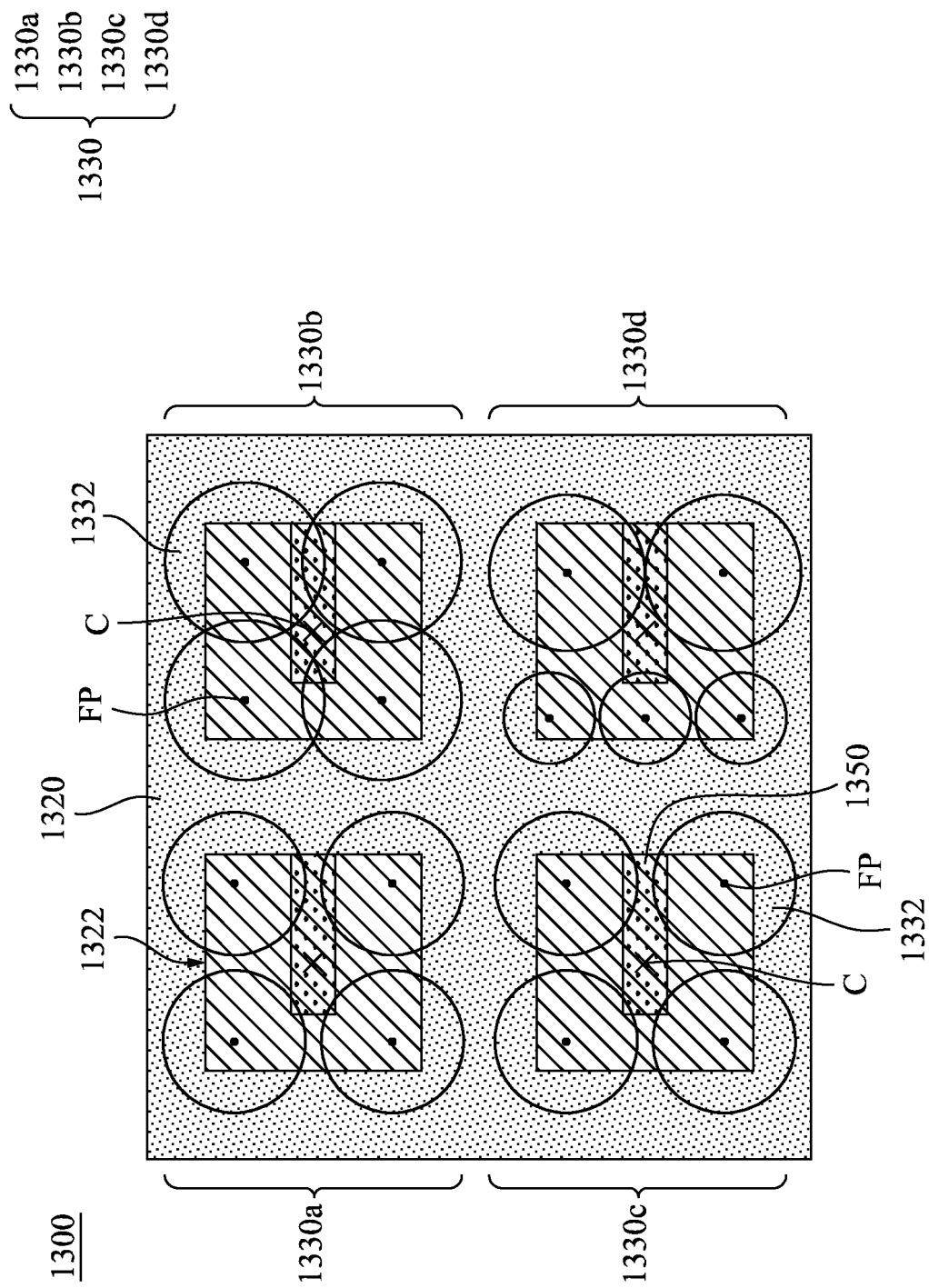
FIG. 15 is a schematic top view of the image sensor according to a thirteenth embodiment of the disclosure.

Reference is made to FIG. 15, which is a schematic top view of the image sensor according to a thirteenth embodiment of the disclosure. The image sensor 1300 includes a plurality of optical components 1330 disposed over the grid 1320 and corresponding to the photodiodes 1314, respectively. The optical components 1330 are disposed over the apertures 1322, respectively. The optical components 1330 are spaced apart from each other and have at least two different arrangements. The metal pads 1350 are disposed between the optical components 1330 and the photodiodes 1314, respectively. Each metal pad 1350 overlaps the center C of the corresponding photodiodes 1314.

For example, the first optical component 1330a and the third optical component 1330c have the same arrangement. The first optical component 1330a, the second optical component 1330b, and the fourth optical component 1330d have the different arrangements. The focus points FP of the lenses 1332 of each optical component 1330 misalign the corresponding metal pad 1350 in the plan view, such that the light converged by the lenses 1332 of the optical components 1330 can directly focus on the photodiodes 1314 and would not be blocked by the metal pads 1350.

Figure 16:
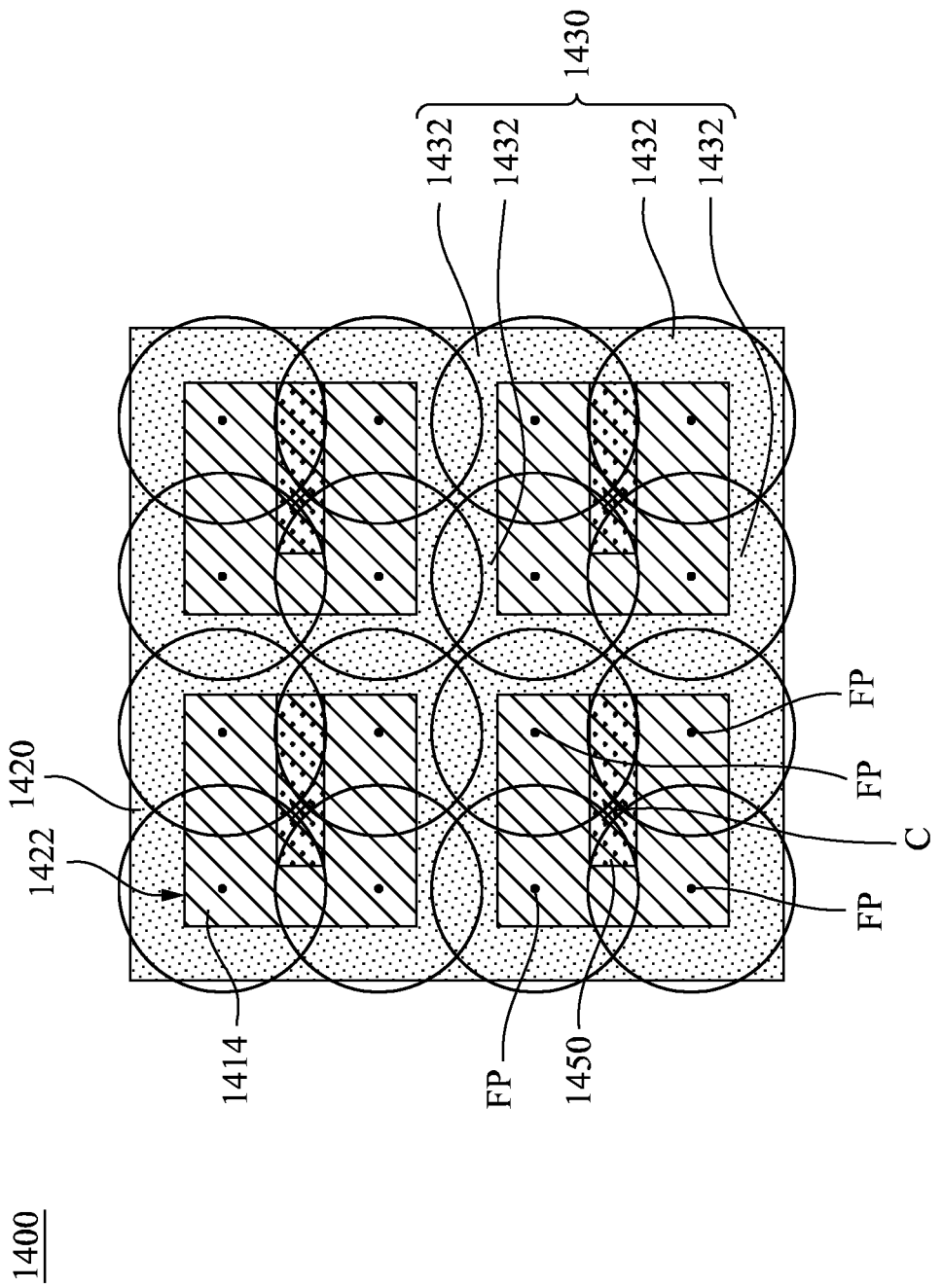
FIG. 16 is a schematic top view of the image sensor according to a fourteenth embodiment of the disclosure.

Reference is made to FIG. 16, which is a schematic top view of the image sensor according to a fourteenth embodiment of the disclosure. The image sensor 1400 includes a plurality of optical components 1430 disposed over the grid 1420 and corresponding to the photodiodes 1414, respectively. The optical components 1430 are disposed over the apertures 1422, respectively. The metal pads 1450 are disposed between the optical components 1430 and the photodiodes 1414, respectively. Each metal pad 1450 overlaps the center C of the corresponding photodiodes 1414.

In some embodiments, the optical components 1430 are further connected. For example, the lenses 1432 of each optical component 1430 are merged, and the lenses 1432 of adjacent optical component 1430 are also merged. The focus points FP of the lenses 1432 of each optical component 1430 misalign the corresponding metal pad 1450 in the plan view, such that the light converged by the lenses 1432 of the optical components 1430 can directly focus on the photodiodes 1414 and would not be blocked by the metal pads 1450.

Figure 17:
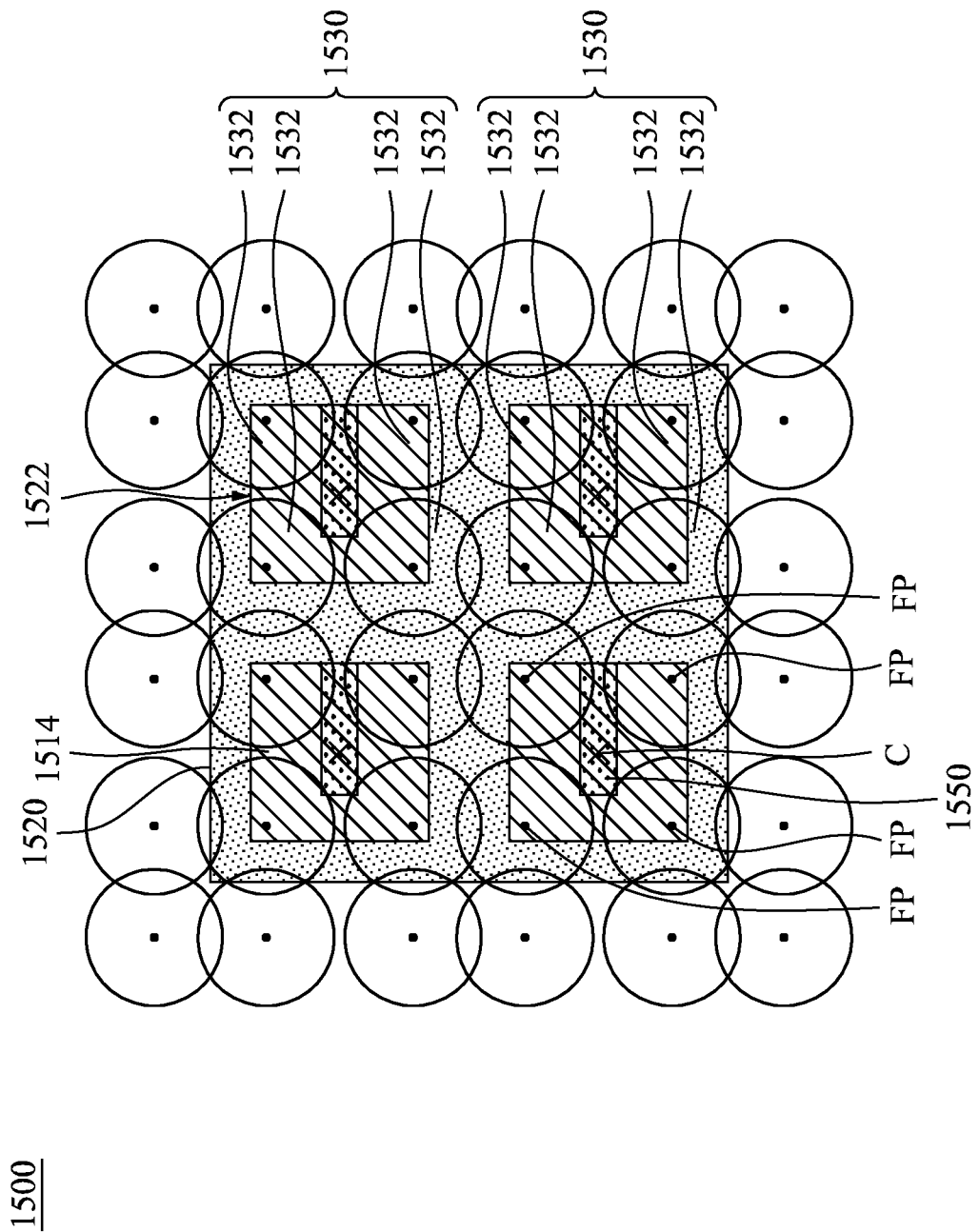
FIG. 17 is a schematic top view of the image sensor according to a fifteenth embodiment of the disclosure.

Reference is made to FIG. 17, which is a schematic top view of the image sensor according to a fifteenth embodiment of the disclosure. The image sensor 1500 includes a plurality of optical components 1530 disposed over the grid 1520 and corresponding to the photodiodes 1514, respectively. The optical components 1530 are disposed over the apertures 1522, respectively. The metal pads 1550 are disposed between the optical components 1530 and the photodiodes 1514, respectively. Each metal pad 1550 overlaps the center C of the corresponding photodiodes 1514.

In some embodiments, the optical components 1530 are further connected. For example, the lenses 1532 of adjacent optical component 1530 are merged. The lenses 1532 within each optical component 1530 are isolated from each other. The focus points FP of the lenses 1532 of each optical component 1530 misalign the corresponding metal pad 1550 in the plan view, such that the light converged by the lenses 1532 of the optical components 1530 can directly focus on the photodiodes 1514 and would not be blocked by the metal pads 1550.

Figure 18:
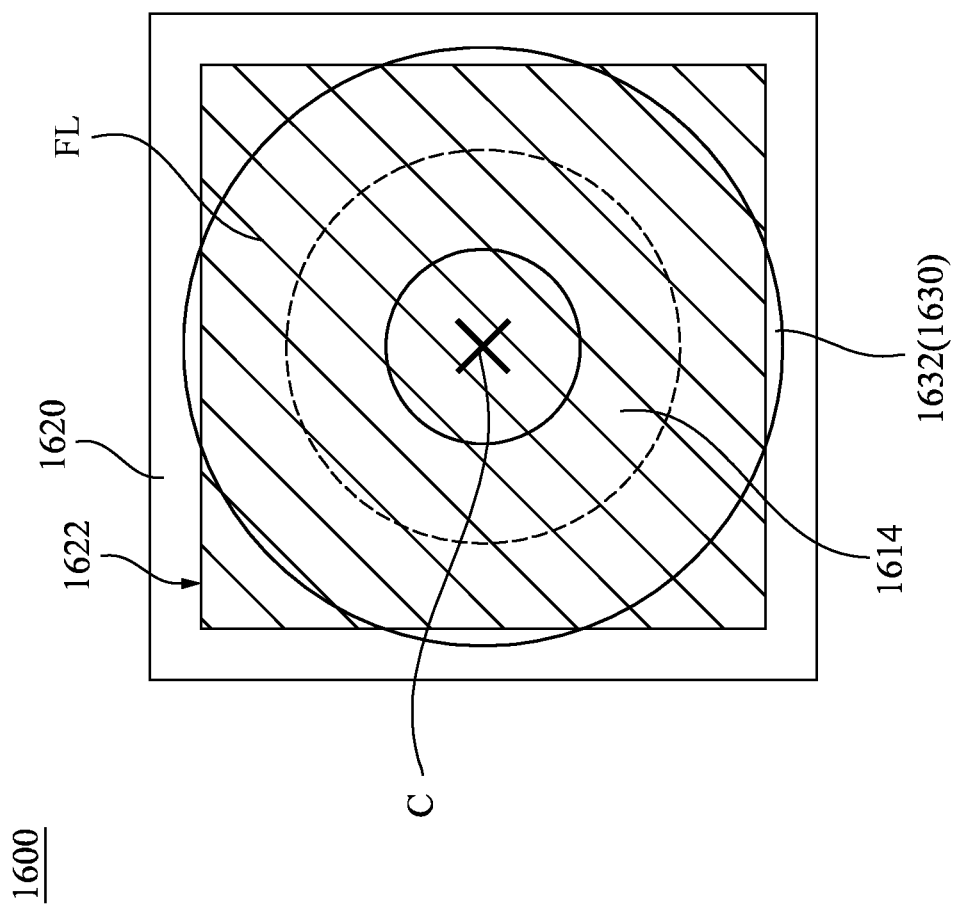
FIG. 18 is a schematic top view of the image sensor according to a sixteenth embodiment of the disclosure.

Reference is made to FIG. 18, which is a schematic top view of the image sensor according to a sixteenth embodiment of the disclosure. The image sensor 1600 includes the optical component 1630 disposed over the aperture 1622 of the grid 1620 and corresponding to the photodiode 1614. The optical component 1630 has a single lens 1632, and the lens 1632 provides a focus line FL on the photodiode 1614, to converge light on the photodiode 1614. The focus line FL of the lens 1632 misaligns a center C of the photodiode 1614, in the plan view. In some embodiments, a shape of the lens 1632 of the optical component 1630 is a donut-shape.

Figure 19:
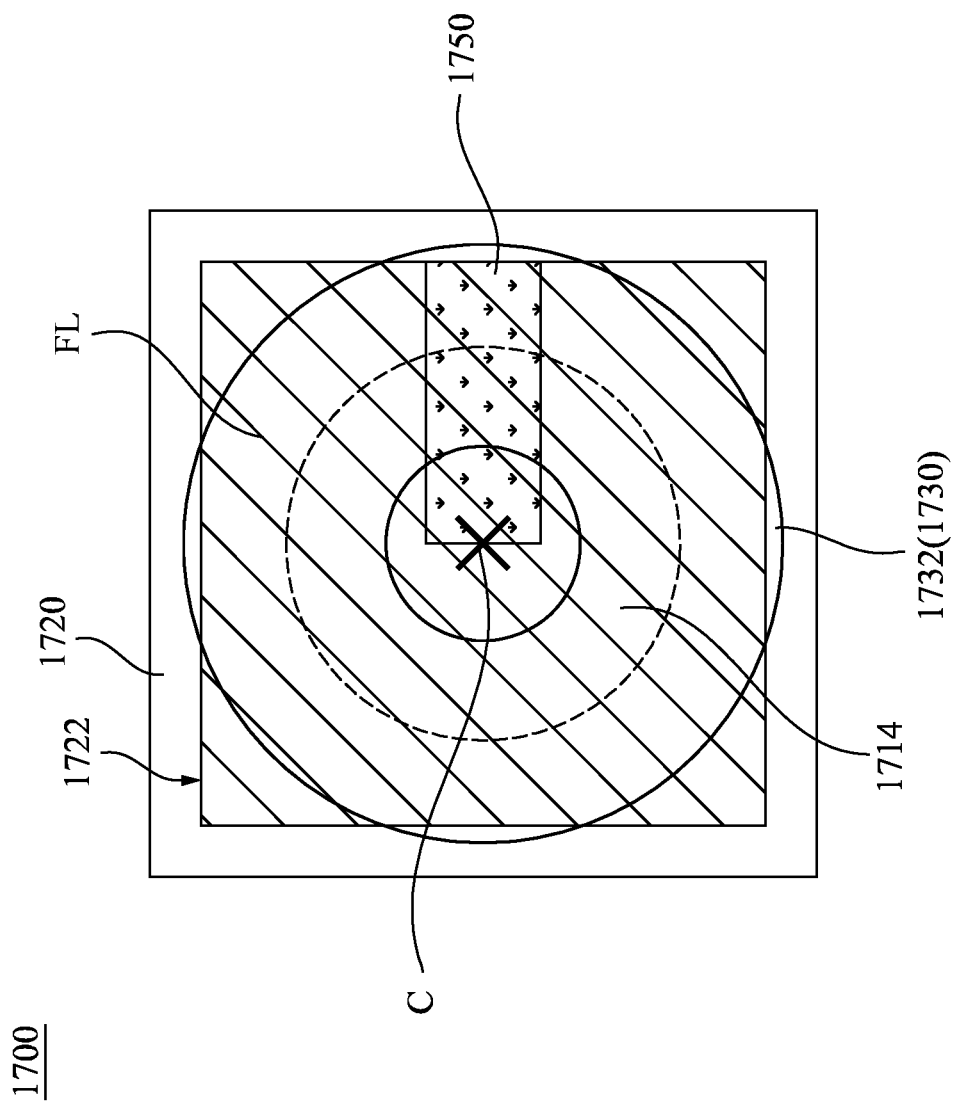
FIG. 19 is a schematic top view of the image sensor according to a seventeenth embodiment of the disclosure.

Reference is made to FIG. 19, which is a schematic top view of the image sensor according to a seventeenth embodiment of the disclosure. The image sensor 1700 includes the optical component 1730 disposed over the aperture 1722 of the grid 1720 and corresponding to the photodiode 1714. The optical component 1730 has the single donut-shape lens 1732. The image sensor 1700 further includes the metal pad 1750 disposed between the optical component 1730 and the photodiode 1714. The metal pad 1750 overlaps the center C of the photodiode 1714. The focus line FL on the photodiode 1714 lands on the photodiode 1714. The focus line FL of the lens 1732 misaligns the metal pad 1750, in the plan view.

Figure 20:
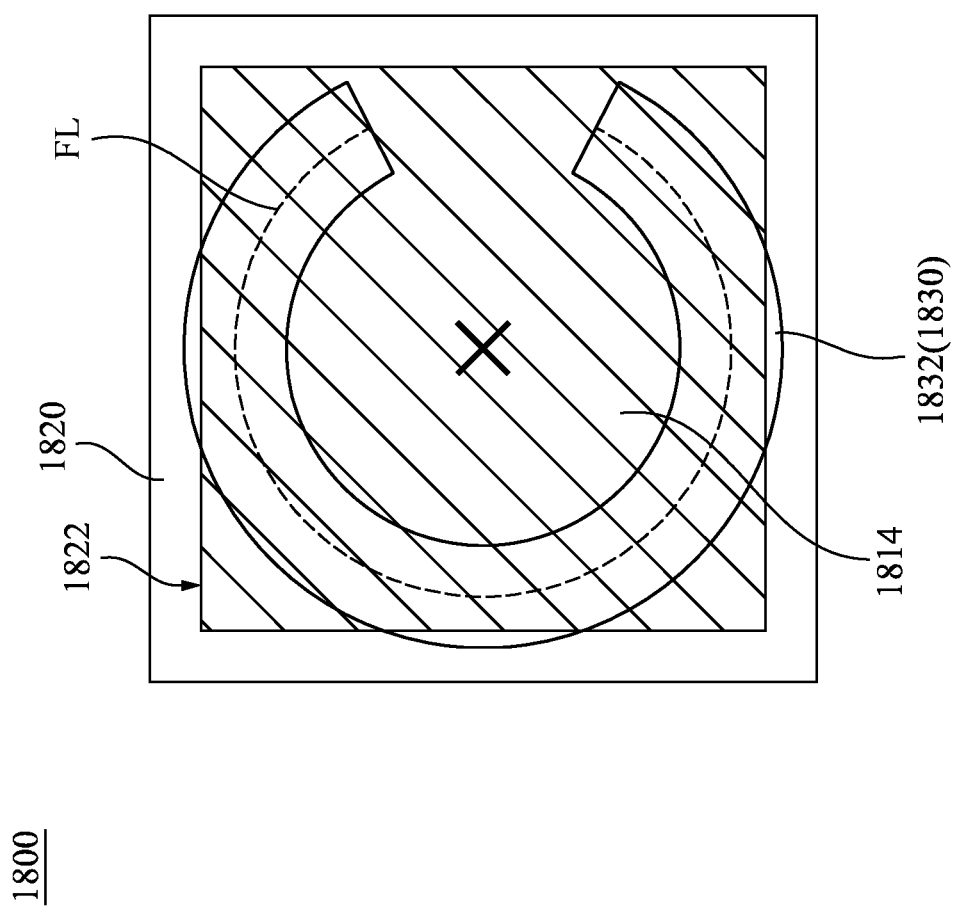
FIG. 20 is a schematic top view of the image sensor according to an eighteenth embodiment of the disclosure.

Reference is made to FIG. 20, which is a schematic top view of the image sensor according to an eighteenth embodiment of the disclosure. The image sensor 1800 includes the optical component 1830 disposed over the aperture 1822 of the grid 1820 and corresponding to the photodiode 1814. The optical component 1830 has a single lens 1832, and the lens 1832 provides a focus line FL on the photodiode 1814, to converge light on the photodiode 1814. The focus line FL of the lens 1832 misaligns a center C of the photodiode 1814, in the plan view. In some embodiments, a shape of the lens 1832 of the optical component 1830 is a C-shape.

Figure 21:
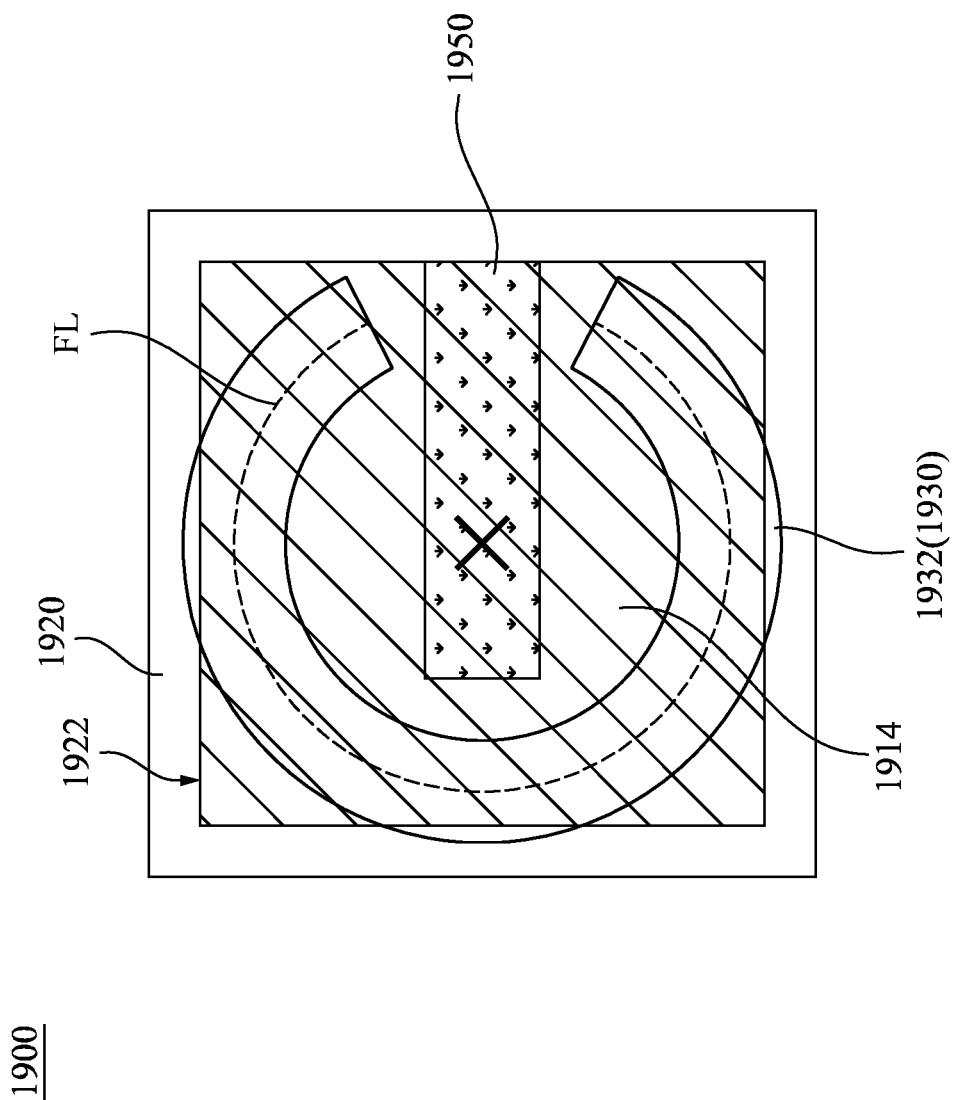
FIG. 21 is a schematic top view of the image sensor according to a nineteenth embodiment of the disclosure.

Reference is made to FIG. 21, which is a schematic top view of the image sensor according to a nineteenth embodiment of the disclosure. The image sensor 1900 includes the optical component 1930 disposed over the aperture 1922 of the grid 1920 and corresponding to the photodiode 1914. The optical component 1930 has the single C-shape lens 1932. The image sensor 1900 further includes the metal pad 1950 disposed between the optical component 1930 and the photodiode 1914. The metal pad 1950 overlaps the center C of the photodiode 1914. The focus line FL of the lens 1932 lands on the photodiode 1914. The focus line FL of the lens 1932 misaligns the metal pad 1950, in the plan view.

Figure 22:
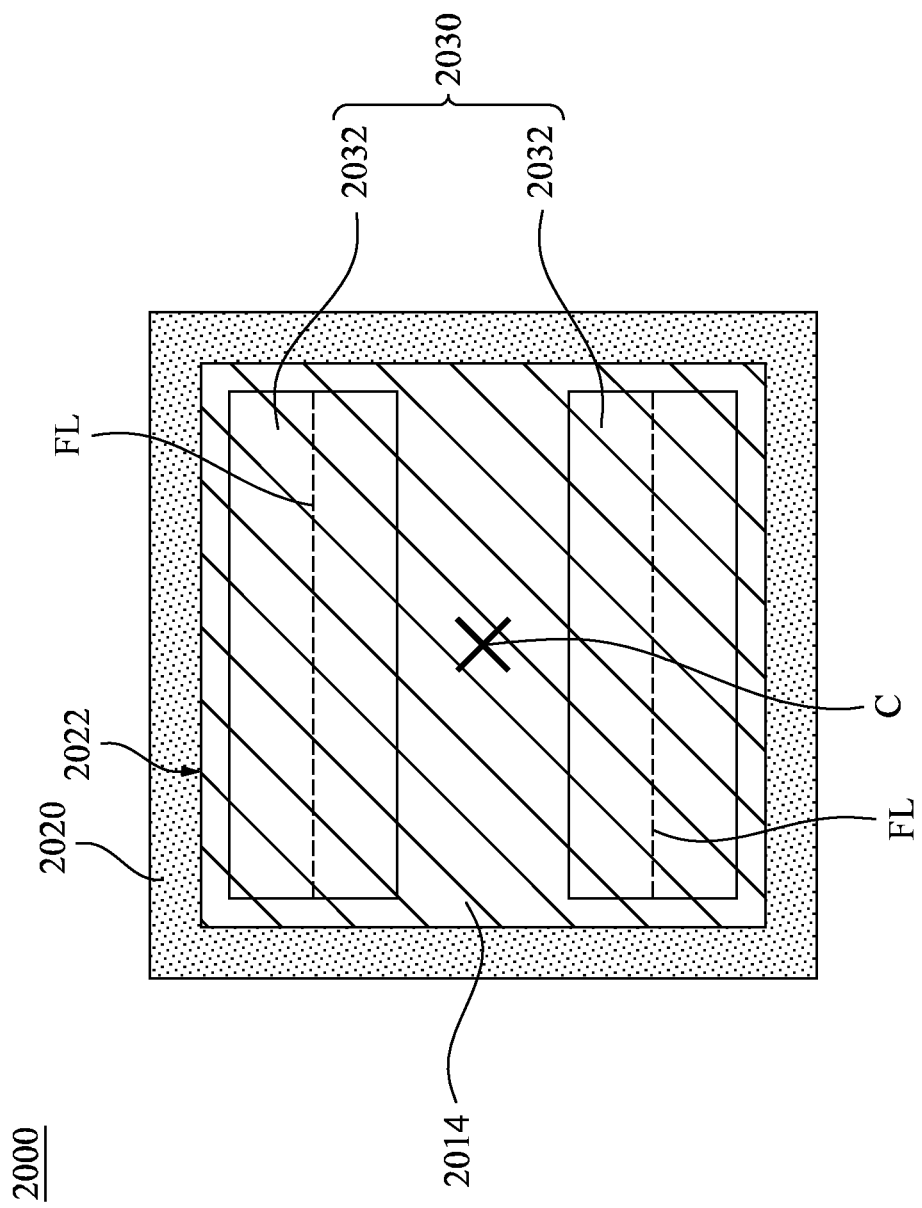
FIG. 22 is a schematic top view of the image sensor according to a twentieth embodiment of the disclosure.

Reference is made to FIG. 22, which is a schematic top view of the image sensor according to a twentieth embodiment of the disclosure. The image sensor 2000 includes the optical component 2030 disposed over the aperture 2022 of the grid 2020 and corresponding to the photodiode 2014. The optical component 2030 has a plurality of lenses 2032, and the lenses 2032 are lenticular lenses. The lenses 2032 provide a plurality of focus lines FL on the photodiode 2014, to converge light on the photodiode 2014. The focus lines FL of the lens 2032 misalign a center C of the photodiode 2014, in the plan view. In some embodiments, there are two lenticular lenses 2032 parallel arranged over the photodiode 2014.

Figure 23:
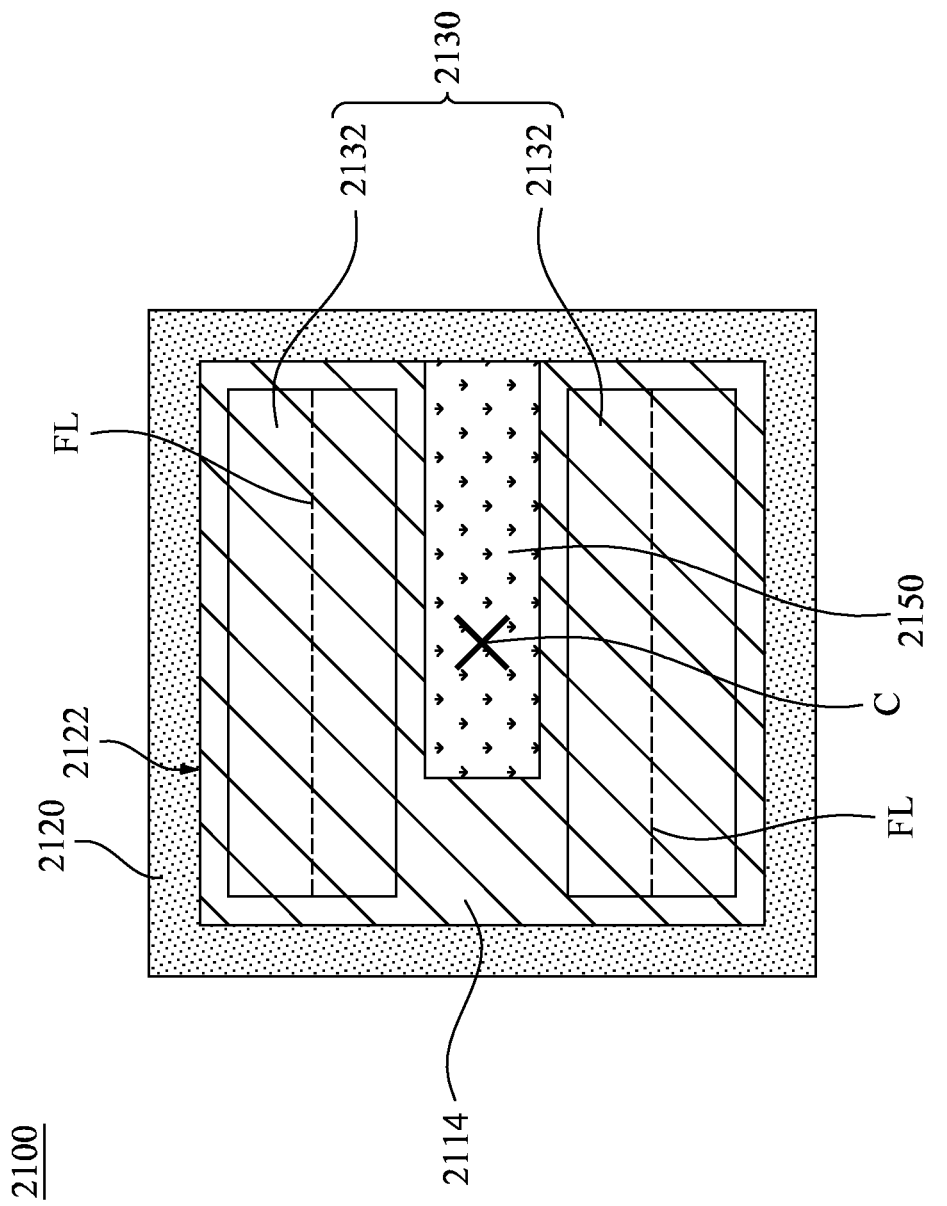
FIG. 23 is a schematic top view of the image sensor according to a twenty-first embodiment of the disclosure.

Reference is made to FIG. 23, which is a schematic top view of the image sensor according to a twenty-first embodiment of the disclosure. The image sensor 2100 includes the optical component 2130 disposed over the aperture 2122 of the grid 2120 and corresponding to the photodiode 2114. The image sensor 2100 further includes the metal pad 2150 disposed between the optical component 2130 and the photodiode 2114. The metal pad 2150 overlaps the center C of the photodiode 2114. The optical component 2130 includes a plurality of lenticular lenses 2132. The focus lines FL of the lenticular lenses 2132 land on the photodiode 2114. The focus lines FL of the lenticular lenses 2132 misalign the metal pad 2150, in the plan view. In some embodiments, the lenticular lenses 2132 and the metal pad 2150 are parallel arranged over the photodiode 2114.

Figure 24:
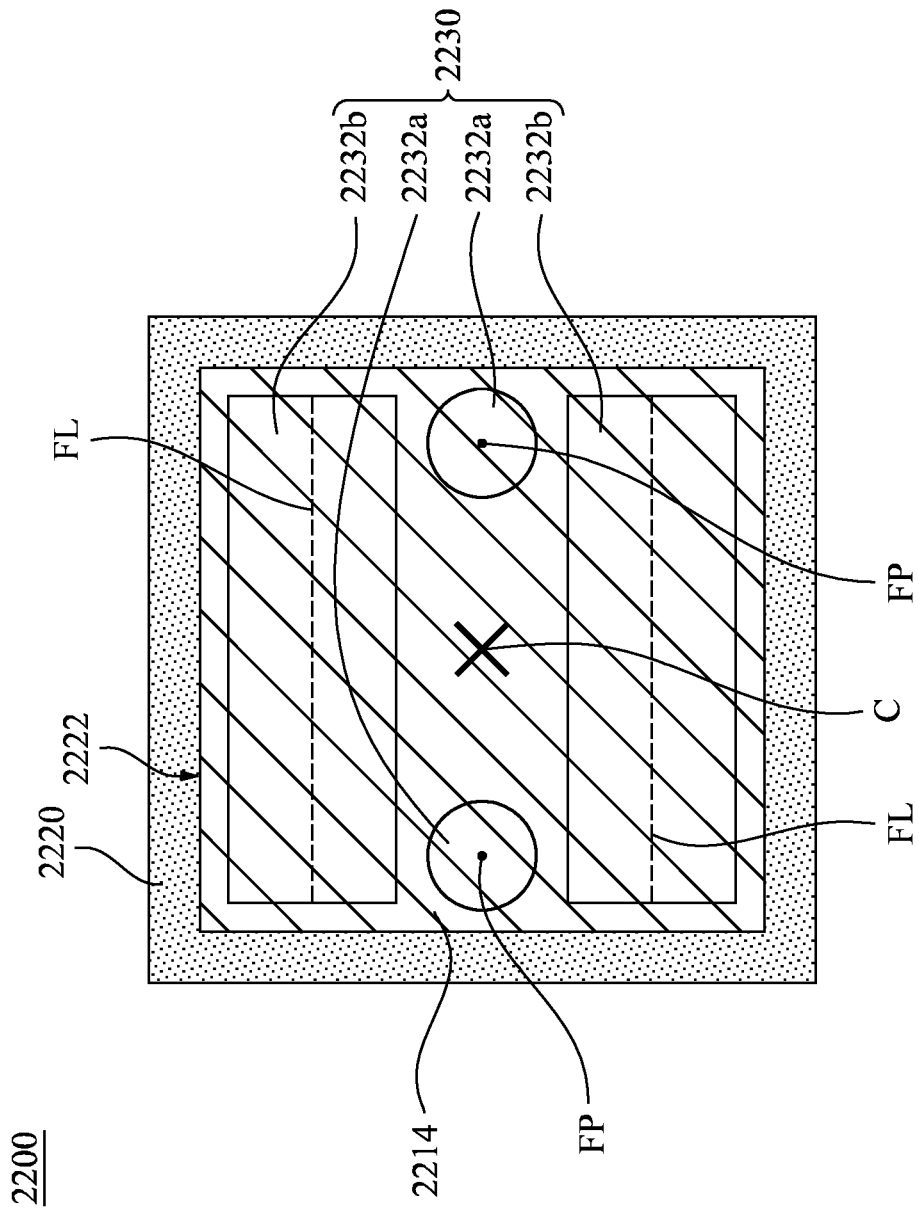
FIG. 24 is a schematic top view of the image sensor according to a twenty-second embodiment of the disclosure.

Reference is made to FIG. 24, which is a schematic top view of the image sensor according to a twenty-second embodiment of the disclosure. The image sensor 2200 includes the optical component 2230 disposed over the aperture 2222 of the grid 2220 and corresponding to the photodiode 2214. The optical component 2230 has a plurality of lenses including a combination of circular lenses 2232a and lenticular lenses 2232b. The circular lenses 2232a provide focus points FP on the photodiode 2214, and the lenticular lenses 2232b provide focus lines FL on the photodiode 2214. The focuses of the optical component 2230, e.g. the focus points FP of the circular lenses 2232a and the focus lines FL of the lenticular lenses 2232b, misalign a center C of the photodiode 2214, in the plan view.

Figure 25:
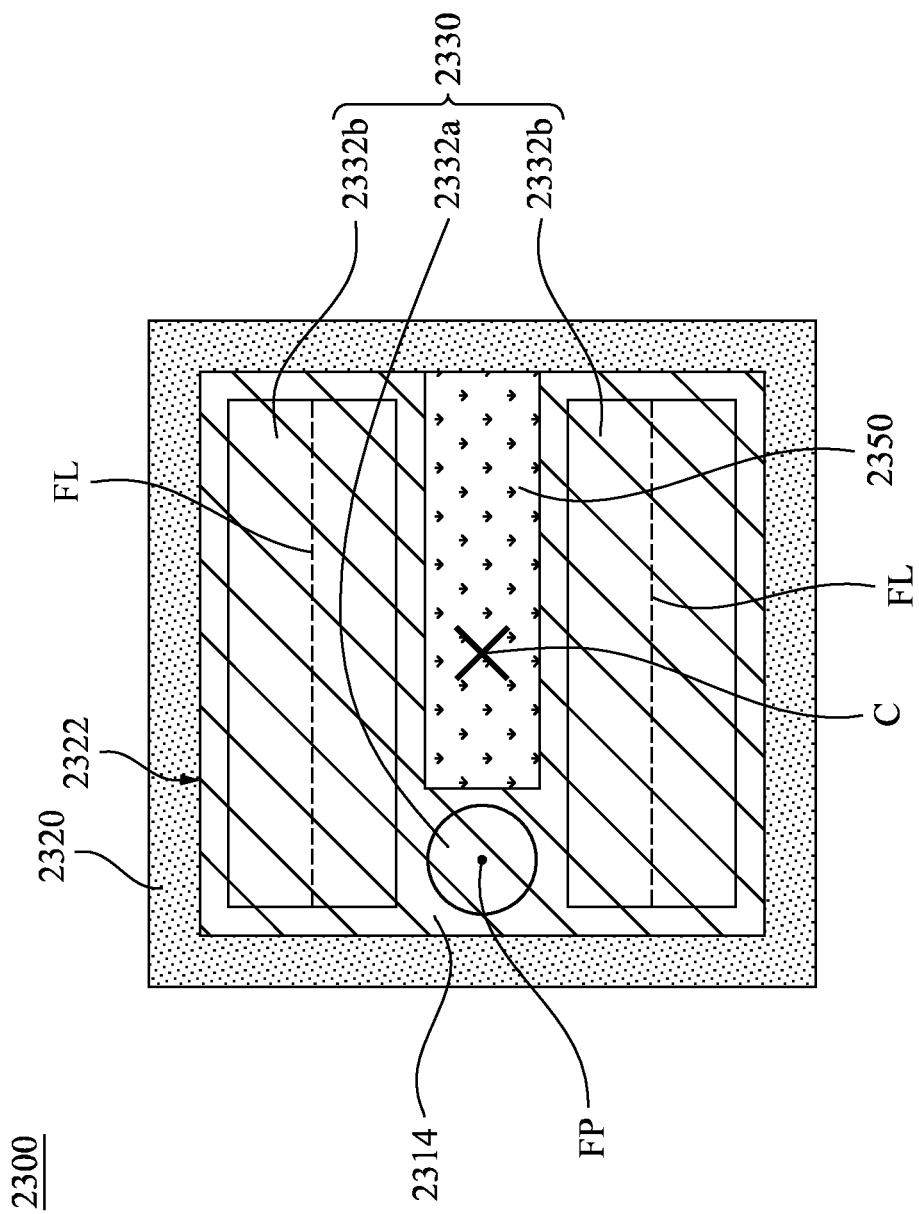
FIG. 25, which is a schematic top view of the image sensor according to a twenty-third embodiment of the disclosure.

Reference is made to FIG. 25, which is a schematic top view of the image sensor according to a twenty-third embodiment of the disclosure. The image sensor 2300 includes the optical component 2330 disposed over the aperture 2322 of the grid 2320 and corresponding to the photodiode 2314. The metal pad 2350 is disposed between the optical component 2330 and the photodiode 2314. The optical component 2330 has a plurality of lenses including a combination of at least one circular lens 2332a and a plurality of lenticular lens 2332b. The circular lens 2332a provides a focus point FP on the photodiode 2314, and the lenticular lenses 2332b provide focus lines FL on the photodiode 2314. The focuses of the optical component 2330, e.g. the focus point FP of the circular lens 2332a and the focus lines FL of the lenticular lenses 2332b, misalign the metal pad 2350, in the plan view.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the invention. In view of the foregoing, it is intended that the present disclosure cover modifications and variations of this invention provided they fall within the scope of the following claims and their equivalents.

What is claimed is:

1. An image sensor comprising:
    a photodiode array comprising a plurality of photodiodes;
    a grid disposed over the photodiode array, wherein the grid defines a plurality of apertures corresponding to the plurality of photodiodes, respectively;
    a plurality of optical components disposed over the grid and corresponding to the plurality of apertures, respectively, wherein the plurality of optical components comprise a first optical component above a first photodiode of the plurality of photodiodes, the first optical component comprises at least one lens and provides at least one focus on the first photodiode, wherein the focus of the lens of the first optical component misaligns a center of the first photodiode, in a plan view; and
    a metal pad disposed between the first photodiode and the first optical component, wherein the metal pad overlaps the center of the first photodiode, in the plan view.

2. The image sensor of claim 1, wherein a number of the at least one lens of the first optical component is plural, and the focuses of the lenses of the first optical component misalign the center of the first photodiode, in the plan view.

3. The image sensor of claim 2, wherein the focuses of the lenses of the first optical component are selected from a group consisting of focus points, focus lines, and a combination thereof.

4. The image sensor of claim 2, wherein the lenses of the first optical component have at least two diameters, in the plan view.

5. The image sensor of claim 2, wherein the lenses of the first optical component have the same size.

6. The image sensor of claim 2, wherein the lenses of the first optical component are circular lenses, lenticular lenses, or a combination thereof.

7. The image sensor of claim 2, wherein an arrangement of the lenses of the first optical component is symmetrical.

8. The image sensor of claim 2, wherein the lenses of the first optical component are isolated from each other.

9. The image sensor of claim 2, wherein at least two of the lenses of the first optical component are merged or in contact.

10. The image sensor of claim 2, wherein at least two of the lenses of the first optical component are merged or in contact, and at least two of the lenses of the first optical component are isolated from each other.

11. The image sensor of claim 1, wherein a number of the at least one lens of the first optical component is single.

12. The image sensor of claim 11, wherein a shape of the lens of the first optical component is a donut-shape or a C-shape, in the plan view.

13. The image sensor of claim 1, wherein the plurality of optical components comprise a second optical component above a second photodiode of the plurality of photodiodes, the second optical component comprises at least one lens and provides at least one focus on the second photodiode, wherein the focus of the lens of the second optical component misaligns a center of the second photodiode, in the plan view.

14. The image sensor of claim 13, wherein an arrangement of the at least one lens of the second optical component is different from an arrangement of the at least one lens of the first optical component.

15. The image sensor of claim 13, wherein an arrangement of the at least one lens of the second optical component is the same as an arrangement of the at least one lens of the first optical component.

16. The image sensor of claim 13, wherein the second optical component is spaced from the first optical component.

17. The image sensor of claim 13, wherein the second optical component is connected to the first optical component.

18. The image sensor of claim 1, further comprising a plurality of waveband filters filled in the apertures, respectively.

* * * * *